US011579953B2

(12) United States Patent
Katrak et al.

(10) Patent No.: US 11,579,953 B2
(45) Date of Patent: Feb. 14, 2023

(54) METHOD FOR ENCODED DIAGNOSTICS IN A FUNCTIONAL SAFETY SYSTEM

(71) Applicant: Fort Robotics, Inc., Philadelphia, PA (US)

(72) Inventors: Kerfegar Khurshed Katrak, Philadelphia, PA (US); Nathan Bivans, Philadelphia, PA (US)

(73) Assignee: Fort Robotics, Inc., Philadelphia, PA (US)

( * ) Notice: Subject to any disclaimer, the term of this patent is extended or adjusted under 35 U.S.C. 154(b) by 0 days.

(21) Appl. No.: 17/856,661

(22) Filed: Jul. 1, 2022

(65) Prior Publication Data

US 2023/0006697 A1 Jan. 5, 2023

Related U.S. Application Data

(60) Provisional application No. 63/217,674, filed on Jul. 1, 2021, provisional application No. 63/217,682, filed (Continued)

(51) Int. Cl.
*G06F 11/07* (2006.01)
*H03M 13/15* (2006.01)
(Continued)

(52) U.S. Cl.
CPC ...... *G06F 11/0706* (2013.01); *G06F 11/0766* (2013.01); *H03M 13/1525* (2013.01);
(Continued)

(58) Field of Classification Search
CPC ............... G06F 11/0706; G06F 11/008; G06F 11/0736; G06F 11/0766; H03M 13/1575;
(Continued)

(56) References Cited

U.S. PATENT DOCUMENTS 6,105,150 A * 8/2000 Noguchi ............. G06F 11/0778
714/45
6,792,562 B1 * 9/2004 Korhonen ........... G06F 11/0706
714/39

(Continued)

FOREIGN PATENT DOCUMENTS

WO   2021178693 A1   9/2021

OTHER PUBLICATIONS

International Search Report for International Application No. PCT/US21/20911 dated Jun. 1, 2021.

(Continued)

*Primary Examiner* — Steve N Nguyen
(74) *Attorney, Agent, or Firm* — Run8 Patent Group, LLC; Peter Miller; Brian T. Chew

(57) ABSTRACT

A method includes, storing a set of valid codewords including: a first valid functional codeword representing a functional state of a controller subsystem; a first valid fault codeword representing a fault state of the controller subsystem and characterized by a minimum hamming distance from the first valid functional codeword; a second valid functional codeword representing a functional state of a controller; and a second valid fault codeword representing a fault state of the controller; in response to detecting functional operation of the controller subsystem, storing the first valid functional codeword in a first memory; in response to detecting a match between contents of the first memory and the first valid functional codeword, outputting the second valid functional codeword; in response to detecting a mismatch between contents of the first memory and every codeword in the first set of valid codewords, outputting the second valid fault codeword.

20 Claims, 7 Drawing Sheets

Related U.S. Application Data on Jul. 1, 2021, provisional application No. 63/217,684, filed on Jul. 1, 2021.

(51) Int. Cl.
   *H03M 13/19* (2006.01)
   *G06F 11/00* (2006.01)

(52) U.S. Cl.
   CPC ....... *H03M 13/1575* (2013.01); *H03M 13/19* (2013.01); *G06F 11/008* (2013.01)

(58) Field of Classification Search
   CPC .. H03M 13/1525; H03M 13/19; G01R 31/282
   See application file for complete search history.

(56) References Cited

U.S. PATENT DOCUMENTS

| | | | |
|---|---|---|---|
| 8,874,818 B2* | 10/2014 | Felth | .................. G06F 13/4295 |
| | | | 710/305 |
| 17,332,635 | 5/2021 | Katrak | |
| 17,332,657 | 5/2021 | Katrak | |
| 11,372,796 B2 | 6/2022 | Culca et al. | |
| 17,856,661 | 7/2022 | Katrak | |
| 17,856,700 | 7/2022 | Katrak | |
| 11,455,223 B2* | 9/2022 | Nagy | .................. G06F 11/2273 |
| 2004/0008467 A1* | 1/2004 | Calandre | .............. G05B 19/042 |
| | | | 361/119 |
| 2004/0078116 A1 | 4/2004 | Hashimoto et al. | |
| 2009/0043939 A1* | 2/2009 | Fuessl | ............... H04L 12/40032 |
| | | | 710/305 |
| 2009/0055561 A1* | 2/2009 | Ritz | ......................... G05B 9/02 |
| | | | 710/100 |
| 2009/0292951 A1* | 11/2009 | Fournier | ............ G05B 23/0251 |
| | | | 714/E11.178 |
| 2013/0145214 A1 | 6/2013 | Provencher et al. | |
| 2014/0372758 A1 | 12/2014 | Agiwal et al. | |
| 2018/0232270 A1* | 8/2018 | Otsuka | ................. G06F 11/0706 |
| 2019/0378610 A1 | 12/2019 | Barral et al. | |
| 2021/0073098 A1* | 3/2021 | Maruyama | ......... G06F 11/0709 |
| 2021/0282117 A1 | 9/2021 | Bivans | |

OTHER PUBLICATIONS

Non-Final Office Action for U.S. Appl. No. 17/332,635 dated Mar. 28, 2022.

Notice of Allowance and Fees Due for U.S. Appl. No. 17/332,635 dated Jul. 15, 2022.

* cited by examiner

| MA ALU/CORE | UPPER BYTE UNB | LNB | DECIMAL | LOWER BYTE UNB | LNB | DECIMAL |
|---|---|---|---|---|---|---|
| FI | 13 | 14 | 222 | 14 | 13 | 237 |
| NFI | 8 | 2 | 130 | 2 | 8 | 40 |

| MB ALU/CORE | UPPER BYTE UNB | LNB | DECIMAL | LOWER BYTE UNB | LNB | DECIMAL |
|---|---|---|---|---|---|---|
| FI | 14 | 13 | 237 | 13 | 14 | 222 |
| NFI | 2 | 8 | 40 | 8 | 2 | 130 |

| MA PROGRAM FLOW MONITOR | UPPER BYTE UNB | LNB | DECIMAL | LOWER BYTE UNB | LNB | DECIMAL |
|---|---|---|---|---|---|---|
| FI | 7 | 13 | 125 | 13 | 7 | 215 |
| NFI | 11 | 14 | 190 | 14 | 11 | 235 |

| MB PROGRAM FLOW MONITOR | UPPER BYTE UNB | LNB | DECIMAL | LOWER BYTE UNB | LNB | DECIMAL |
|---|---|---|---|---|---|---|
| FI | 14 | 11 | 235 | 11 | 14 | 190 |
| NFI | 13 | 7 | 215 | 7 | 13 | 125 |

| MA RAM | UPPER BYTE UNB | LNB | DECIMAL | LOWER BYTE UNB | LNB | DECIMAL |
|---|---|---|---|---|---|---|
| FI | 7 | 11 | 123 | 11 | 7 | 183 |
| NFI | 4 | 1 | 65 | 1 | 4 | 20 |

| MB RAM | UPPER BYTE UNB | LNB | DECIMAL | LOWER BYTE UNB | LNB | DECIMAL |
|---|---|---|---|---|---|---|
| FI | 11 | 7 | 183 | 7 | 11 | 123 |
| NFI | 1 | 4 | 20 | 4 | 1 | 65 |

| MA FLASH | UPPER BYTE UNB | LNB | DECIMAL | LOWER BYTE UNB | LNB | DECIMAL |
|---|---|---|---|---|---|---|
| FI | 14 | 13 | 237 | 13 | 14 | 222 |
| NFI | 2 | 8 | 40 | 8 | 2 | 130 |

| MB FLASH | UPPER BYTE UNB | LNB | DECIMAL | LOWER BYTE UNB | LNB | DECIMAL |
|---|---|---|---|---|---|---|
| FI | 13 | 14 | 222 | 14 | 13 | 237 |
| NFI | 8 | 2 | 130 | 2 | 8 | 40 |

| MA STACK UNDERFLOW | UPPER BYTE UNB | LNB | DECIMAL | LOWER BYTE UNB | LNB | DECIMAL |
|---|---|---|---|---|---|---|
| FI | 11 | 7 | 183 | 7 | 11 | 123 |
| NFI | 1 | 4 | 20 | 4 | 1 | 65 |

| MB STACK UNDERFLOW | UPPER BYTE UNB | LNB | DECIMAL | LOWER BYTE UNB | LNB | DECIMAL |
|---|---|---|---|---|---|---|
| FI | 7 | 11 | 123 | 11 | 7 | 183 |
| NFI | 4 | 1 | 65 | 1 | 4 | 20 |

| MA STACK OVERFLOW | UPPER BYTE UNB | LNB | DECIMAL | LOWER BYTE UNB | LNB | DECIMAL |
|---|---|---|---|---|---|---|
| FI | 14 | 11 | 235 | 11 | 14 | 190 |
| NFI | 13 | 7 | 215 | 7 | 13 | 125 |

| MB STACK OVERFLOW | UPPER BYTE UNB | LNB | DECIMAL | LOWER BYTE UNB | LNB | DECIMAL |
|---|---|---|---|---|---|---|
| FI | 7 | 13 | 125 | 13 | 7 | 215 |
| NFI | 11 | 14 | 190 | 14 | 11 | 235 |

*FIGURE 4*

| COMM INFRA WITH MB | UPPER BYTE | | | LOWER BYTE | | |
|---|---|---|---|---|---|---|
| | UNB | LNB | DECIMAL | UNB | LNB | DECIMAL |
| FI | 7 | 11 | 123 | 5 | 12 | 92 |
| NFI | 12 | 5 | 197 | 11 | 7 | 183 |

| COMM CONTENT WITH MB | UPPER BYTE | | | LOWER BYTE | | |
|---|---|---|---|---|---|---|
| | UNB | LNB | DECIMAL | UNB | LNB | DECIMAL |
| FI | 11 | 7 | 183 | 12 | 5 | 197 |
| NFI | 5 | 12 | 92 | 7 | 11 | 123 |

FIGURE 5A

| COMM INFRA WITH MA | UPPER BYTE | | | LOWER BYTE | | |
|---|---|---|---|---|---|---|
| | UNB | LNB | DECIMAL | UNB | LNB | DECIMAL |
| FI | 11 | 7 | 183 | 12 | 5 | 197 |
| NFI | 5 | 12 | 92 | 7 | 11 | 123 |

| COMM CONTENT WITH MA | UPPER BYTE | | | LOWER BYTE | | |
|---|---|---|---|---|---|---|
| | UNB | LNB | DECIMAL | UNB | LNB | DECIMAL |
| FI | 7 | 11 | 123 | 5 | 12 | 92 |
| NFI | 12 | 5 | 197 | 11 | 7 | 183 |

FIGURE 5B

| COMM INFRA WITH AP | UPPER BYTE | | | LOWER BYTE | | |
|---|---|---|---|---|---|---|
| | UNB | LNB | DECIMAL | UNB | LNB | DECIMAL |
| FI | 13 | 14 | 222 | 3 | 10 | 58 |
| NFI | 10 | 3 | 163 | 14 | 13 | 237 |

| COMM CONTENT WITH AP | UPPER BYTE | | | LOWER BYTE | | |
|---|---|---|---|---|---|---|
| | UNB | LNB | DECIMAL | UNB | LNB | DECIMAL |
| FI | 14 | 13 | 237 | 10 | 3 | 163 |
| NFI | 3 | 10 | 58 | 13 | 14 | 222 |

FIGURE 5C

| COMM INFRA WITH AP | UPPER BYTE | | | LOWER BYTE | | |
|---|---|---|---|---|---|---|
| | UNB | LNB | DECIMAL | UNB | LNB | DECIMAL |
| FI | 14 | 13 | 237 | 13 | 3 | 163 |
| NFI | 3 | 10 | 58 | 10 | 14 | 222 |

| COMM CONTENT WITH AP | UPPER BYTE | | | LOWER BYTE | | |
|---|---|---|---|---|---|---|
| | UNB | LNB | DECIMAL | UNB | LNB | DECIMAL |
| FI | 13 | 14 | 222 | 3 | 10 | 58 |
| NFI | 10 | 3 | 163 | 14 | 13 | 237 |

FIGURE 5D

|        |     | UPPER BYTE |     |         | LOWER BYTE |     |         |        |     | UPPER BYTE |     |         | LOWER BYTE |     |         |
|--------|-----|-----|-----|---------|-----|-----|---------|--------|-----|-----|-----|---------|-----|-----|---------|
|        |     | UNB | LNB | DECIMAL | UNB | LNB | DECIMAL |        |     | UNB | LNB | DECIMAL | UNB | LNB | DECIMAL |
| MA D1  | FI  | 14  | 3   | 227     | 7   | 5   | 117     | MB D1  | FI  | 7   | 5   | 117     | 14  | 3   | 227     |
|        | NFI | 7   | 5   | 117     | 14  | 3   | 227     |        | NFI | 14  | 3   | 227     | 7   | 5   | 117     |
| MA D2  | FI  | 2   | 6   | 38      | 11  | 3   | 179     | MB D2  | FI  | 11  | 3   | 179     | 2   | 6   | 38      |
|        | NFI | 11  | 3   | 179     | 2   | 6   | 38      |        | NFI | 2   | 6   | 38      | 11  | 3   | 179     |
| MA D3  | FI  | 11  | 12  | 188     | 13  | 5   | 213     | MB D3  | FI  | 13  | 5   | 213     | 11  | 12  | 188     |
|        | NFI | 13  | 5   | 213     | 11  | 12  | 188     |        | NFI | 11  | 12  | 188     | 13  | 5   | 213     |
| MA D4  | FI  | 8   | 9   | 137     | 14  | 12  | 236     | MB D4  | FI  | 14  | 12  | 236     | 8   | 9   | 137     |
|        | NFI | 14  | 12  | 236     | 8   | 9   | 137     |        | NFI | 8   | 9   | 137     | 14  | 12  | 236     |
| MA D5  | FI  | 13  | 3   | 211     | 7   | 9   | 121     | MB D5  | FI  | 7   | 9   | 121     | 13  | 3   | 211     |
|        | NFI | 7   | 9   | 121     | 13  | 3   | 211     |        | NFI | 13  | 3   | 211     | 7   | 9   | 121     |
| MA D6  | FI  | 14  | 6   | 230     | 11  | 5   | 181     | MB D6  | FI  | 11  | 5   | 181     | 14  | 6   | 230     |
|        | NFI | 11  | 5   | 181     | 14  | 6   | 230     |        | NFI | 14  | 6   | 230     | 11  | 5   | 181     |
| MA D7  | FI  | 14  | 12  | 236     | 13  | 9   | 217     | MB D7  | FI  | 13  | 9   | 217     | 14  | 12  | 236     |
|        | NFI | 13  | 9   | 217     | 14  | 12  | 236     |        | NFI | 14  | 12  | 236     | 13  | 9   | 217     |
| MA D8  | FI  | 11  | 10  | 186     | 14  | 3   | 227     | MB D8  | FI  | 14  | 3   | 227     | 11  | 10  | 186     |
|        | NFI | 14  | 3   | 227     | 11  | 10  | 186     |        | NFI | 11  | 10  | 186     | 14  | 3   | 227     |
| MA D9  | FI  | 11  | 5   | 181     | 7   | 3   | 115     | MB D9  | FI  | 7   | 3   | 115     | 11  | 5   | 181     |
|        | NFI | 7   | 3   | 115     | 11  | 5   | 181     |        | NFI | 11  | 5   | 181     | 7   | 3   | 115     |
| MA D10 | FI  | 1   | 5   | 21      | 11  | 12  | 218     | MB D10 | FI  | 11  | 12  | 188     | 1   | 5   | 21      |
|        | NFI | 11  | 12  | 188     | 1   | 5   | 21      |        | NFI | 1   | 5   | 21      | 11  | 12  | 188     |
| MA D11 | FI  | 8   | 12  | 140     | 13  | 10  | 218     | MB D11 | FI  | 13  | 10  | 217     | 8   | 12  | 140     |
|        | NFI | 13  | 10  | 218     | 8   | 12  | 140     |        | NFI | 8   | 12  | 140     | 13  | 10  | 218     |
| MA D12 | FI  | 7   | 10  | 122     | 13  | 9   | 217     | MB D12 | FI  | 13  | 9   | 217     | 7   | 10  | 122     |
|        | NFI | 14  | 9   | 233     | 7   | 10  | 122     |        | NFI | 7   | 10  | 122     | 14  | 9   | 233     |

*FIGURE 6*

METHOD FOR ENCODED DIAGNOSTICS IN A FUNCTIONAL SAFETY SYSTEM

CROSS-REFERENCE TO RELATED APPLICATIONS

This Application claims the benefit of U.S. Provisional Application Nos. 63/217,674 filed on 1 Jul. 2021, 63/217,682 filed on 1 Jul. 2021, and 63/217,684 filed on 1 Jul. 2021, each of which is incorporated in its entirety by this reference.

This Application is related to U.S. patent application Ser. No. 17/192,657, filed on 4 Mar. 2021, and Ser. No. 17/332,635, filed on 27 May 2021, which are incorporated in its entirety by this reference.

TECHNICAL FIELD

This invention relates generally to the field of functional safety and more specifically to a new and useful method for encoded diagnostics in a functional safety system in the field of functional safety.

BRIEF DESCRIPTION OF THE FIGURES

FIG. 4 is an illustrative table in accordance with one variation of the method;

FIGS. 5A, 5B, 5C, and 5D are illustrative tables in accordance with one variation of the method; and FIG. 6 is an illustrative table in accordance with one variation of the method.

DESCRIPTION OF THE EMBODIMENTS

The following description of embodiments of the invention is not intended to limit the invention to these embodiments but rather to enable a person skilled in the art to make and use this invention. Variations, configurations, implementations, example implementations, and examples described herein are optional and are not exclusive to the variations, configurations, implementations, example implementations, and examples they describe. The invention described herein can include any and all permutations of these variations, configurations, implementations, example implementations, and examples.

1. Methods

Figure 1:
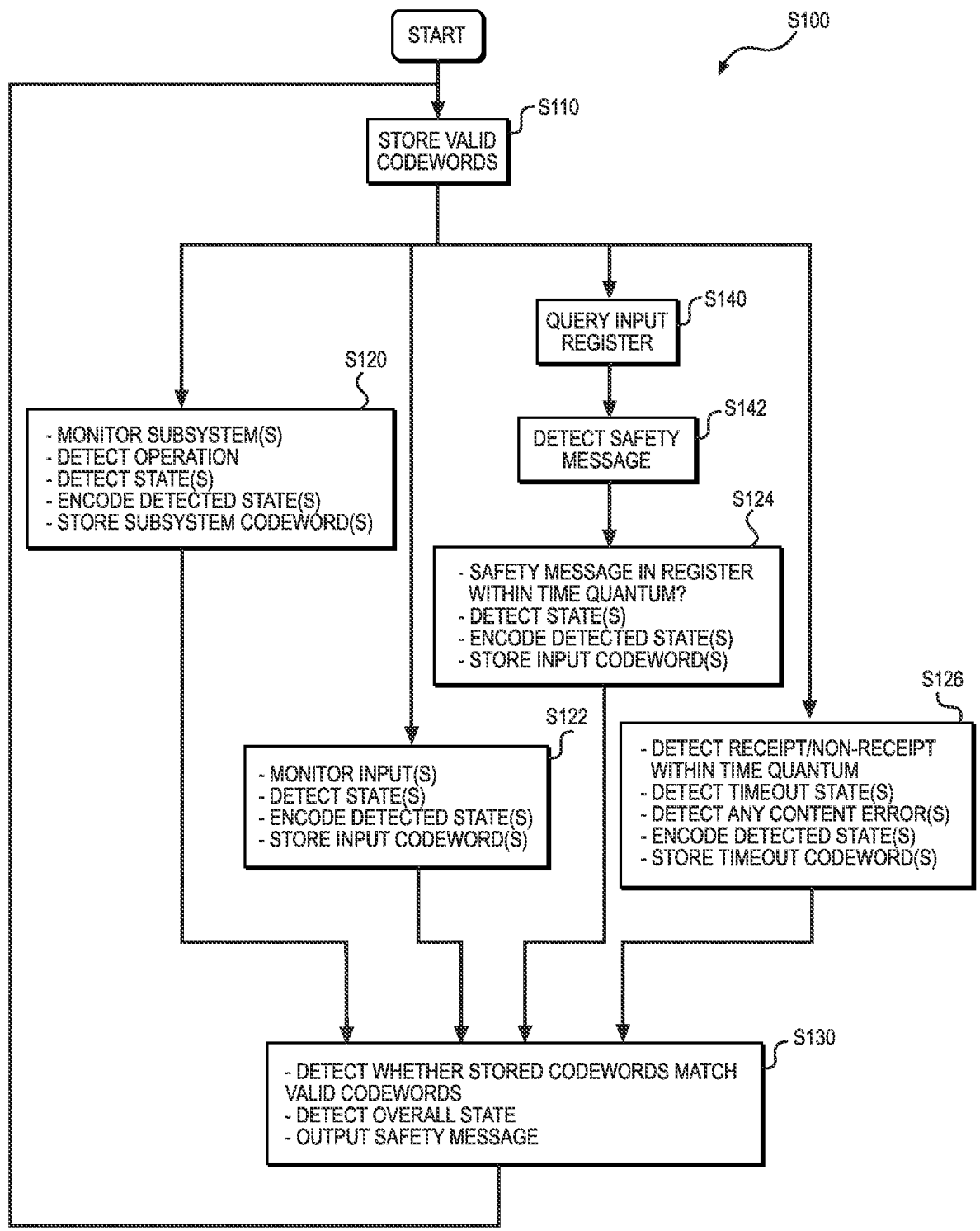
FIG. 1 is a flowchart representation of a method.
Figure 2A:
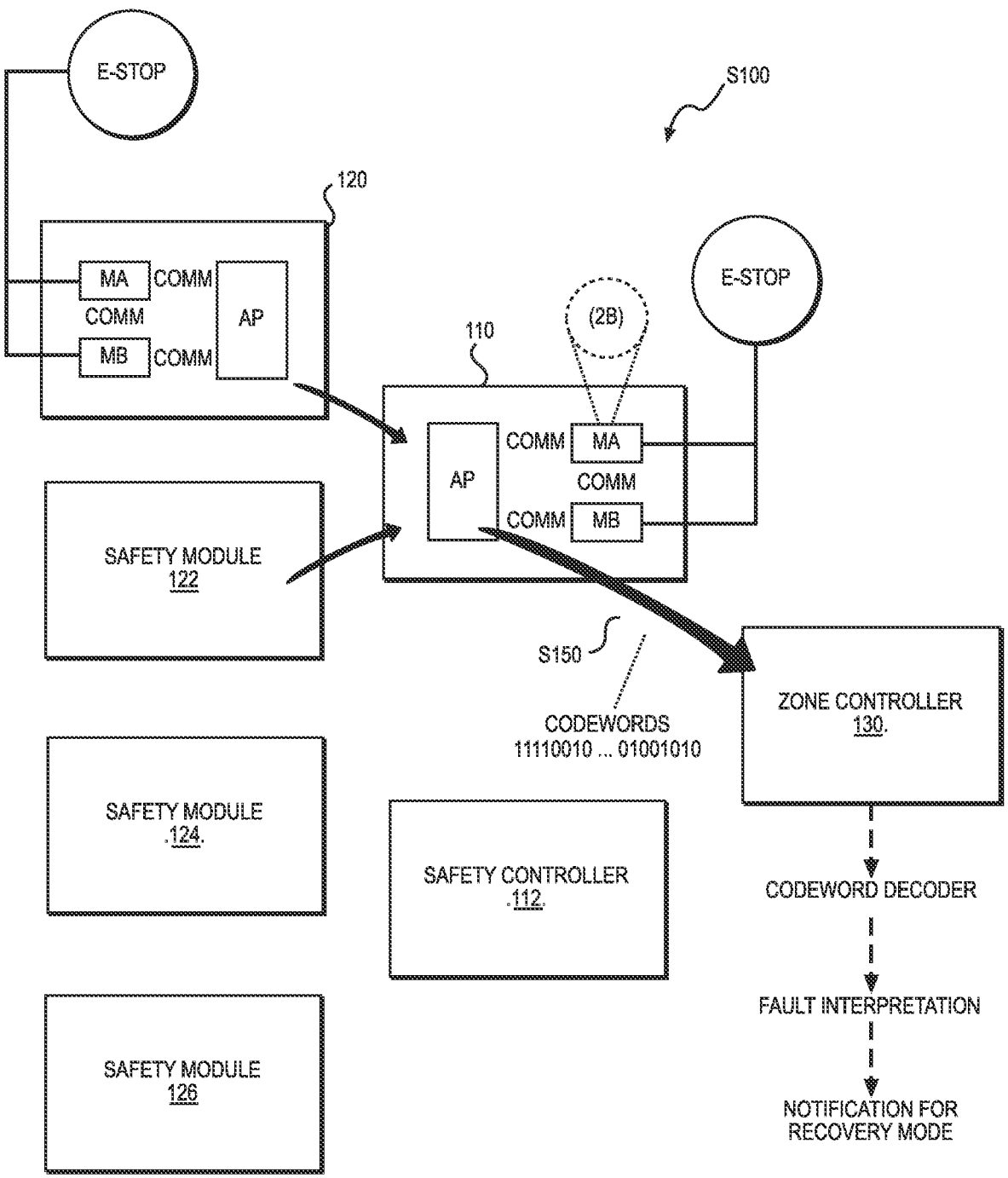
FIGS. 2A and 2B are schematic representations of one variation of the method.
Figure 2B:
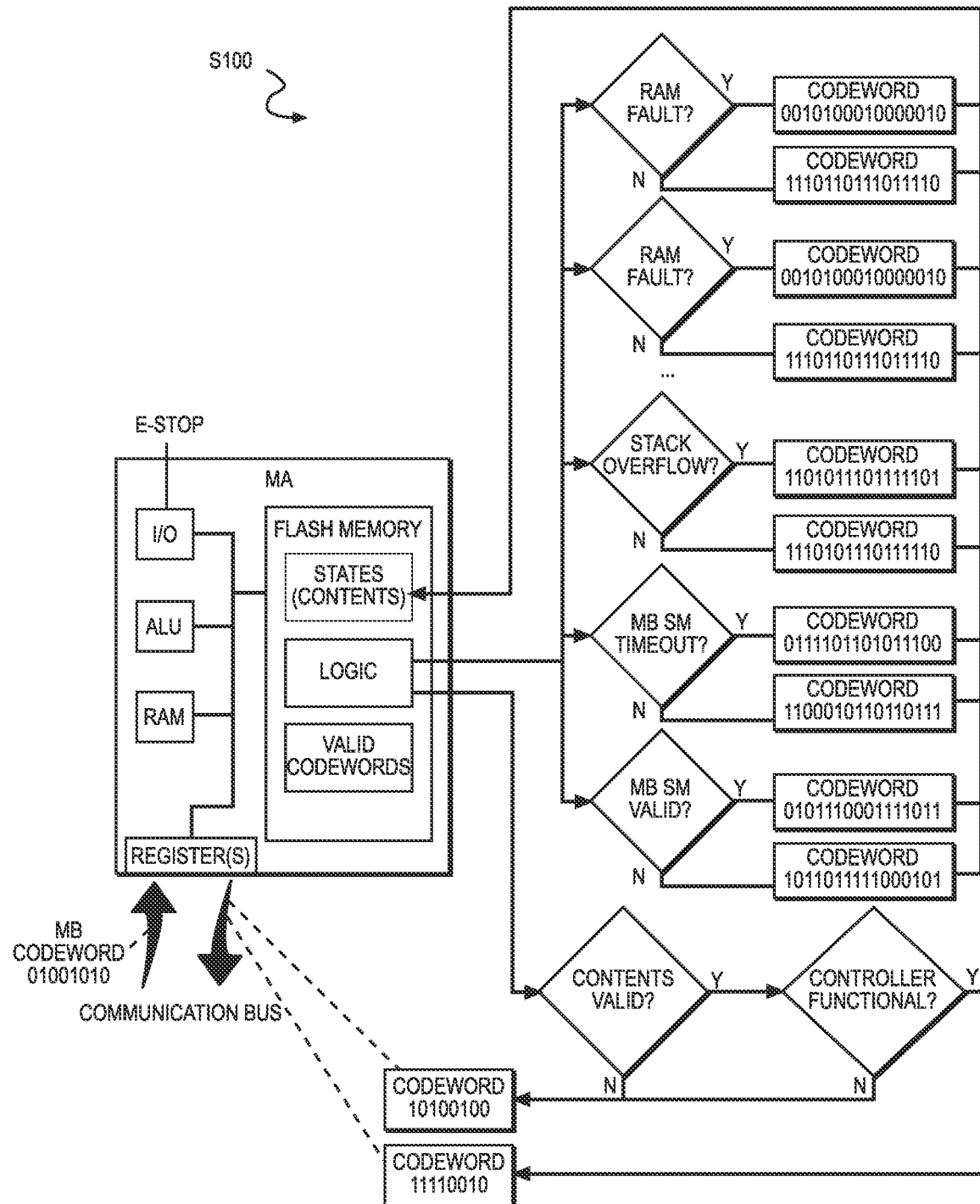

As shown in FIGS. 1, 2A, and 2B, a method S100 includes: at a first controller in a safety module coupled to a system, storing a first set of valid codewords in Block S110 including: a first valid functional codeword representing a functional state of a first subsystem of a first set of subsystems within the first controller; a first valid fault codeword representing a fault state of the first subsystem and characterized by a first minimum hamming distance from the first valid functional codeword; a second valid functional codeword representing a functional state of the first controller; a second valid fault codeword representing a fault state of the first controller and characterized by a second minimum hamming distance from the second valid functional codeword; a third valid functional codeword representing a functional state of a first input coupled to the system; a third valid fault codeword representing a fault state of the first input and characterized by a third minimum hamming distance from the third valid functional codeword; a fourth valid functional codeword representing a functional state of the system; and a fourth valid fault codeword representing a fault state of the system and characterized by a fourth minimum hamming distance from the fourth valid functional codeword.

The method further includes during a first time period, at the first controller: in response to detecting functional operation of the first subsystem, storing the first valid functional codeword in a first memory in Block S120, and in response to detecting functional operation of the first input, storing the third valid functional codeword in a second memory in Block S122.

The method further includes, during a second time period following the first time period, at the first controller, in response to detecting a match between contents of the first memory and the first valid functional codeword, and in response to detecting functional operation of the first input, outputting a first safety message including the second valid functional codeword and the fourth valid functional codeword in Block S130.

The method further includes, during a third time period following the second time period, at the first controller: in response to detecting functional operation of the first subsystem, storing the first valid functional codeword in the first memory in Block S120, and in response to detecting functional operation of the first input, storing the third valid functional codeword in the second memory in Block S122.

The method further includes, during a fourth time period following the third time period, at the first controller, in response to detecting a mismatch between contents of the first memory and every codeword in the first set of valid codewords, outputting a second safety message including the second valid fault codeword and the fourth valid fault codeword in Block S130.

1.1 Controller Infrastructure Diagnostics and Safety Module Timeout

As shown in FIGS. 1, 2A, and 2B, one variation of the method S100 includes, at a first controller in a safety module coupled to a system, storing a first set of valid codewords in Block S110 including: a first valid functional codeword representing a functional state of a first subsystem of a first set of subsystems within the first controller; a first valid fault codeword representing a fault state of the first subsystem and characterized by a first minimum hamming distance from the first valid functional codeword; a second valid functional codeword representing a functional state of the first controller; a second valid fault codeword representing a fault state of the first controller and characterized by a second minimum hamming distance from the second valid functional codeword; a third valid functional codeword representing a functional state of a first input coupled to the system; a third valid fault codeword representing a fault state of the first input and characterized by a third minimum hamming distance from the third valid functional codeword; a fourth valid functional codeword representing a functional state of a second controller within the safety module; a fourth valid fault codeword representing a fault state of the second controller and characterized by a sixth minimum hamming distance from the fourth valid functional codeword; a fifth valid functional codeword representing a functional timeout state of the second controller; a fifth valid fault codeword representing a fault timeout state of the second controller and characterized by a fifth minimum hamming distance from the fourth valid functional codeword; a sixth valid functional codeword representing a functional state of the system; and a sixth valid fault codeword representing a fault state of the system and characterized by a sixth minimum hamming distance from the sixth valid functional codeword.

This variation of the method S100 further includes, during a first time period, at the first controller: in response to detecting functional operation of the first subsystem, storing the first valid functional codeword in a first memory in Block S120; in response to detecting functional operation of the first input, storing the third valid functional codeword in a second memory in Block S122; querying an input register coupled to the second controller in Block S140; detecting, in the input register, a first safety message including the fourth valid functional codeword from the second controller in block S142; and, in response to detecting the first safety message in the input register within a first time quantum, storing the fifth valid functional codeword in a third memory in Block S124.

This variation of the method S100 further includes, during a second time period after the first time period, at the first controller, in response to detecting a match between contents of the first memory and the first valid functional codeword, in response to detecting a match between contents of the third memory and the fifth valid functional codeword, and in response to detecting functional operation of the first input, outputting a second safety message including the second valid functional codeword and the sixth valid functional codeword in Block S130.

This variation of the method S100 further includes, during a third time period after the second time period, at the first controller: in response to detecting functional operation of the first subsystem, storing the first valid functional codeword in the first memory in Block S120; in response to detecting functional operation of the first input, storing the third valid functional codeword in the second memory in Block S122; querying the input register in Block S140; and, in response to detecting non-receipt of the third safety message in the input register within a second time quantum, storing the fifth valid fault codeword in a third memory in Block S124.

This variation of the method S100 further includes, during a fourth time period after the third time period, at the first controller, in response to detecting a match between contents of the first memory and the first valid functional codeword, and in response to detecting a match between contents of the third memory and the fifth valid fault codeword, outputting a fourth safety message including the second valid functional codeword and the sixth valid fault codeword in Block S130.

1.2 Controller Infrastructure Diagnostics

As shown in FIGS. 1, 2A, and 2B, another variation of the method S100 includes, at a first controller in a safety module coupled to a system, storing a first set of valid codewords in Block S110 including: a first valid functional codeword representing a functional state of a first subsystem of a first set of subsystems within the first controller; a first valid fault codeword representing a fault state of the first subsystem and characterized by a first minimum hamming distance from the first valid functional codeword; a second valid functional codeword representing a functional state of the first controller; and a second valid fault codeword representing a fault state of the first controller and characterized by a second minimum hamming distance from the second valid functional codeword.

This variation of the method S100 further includes, during a first time period, at the first controller, in response to detecting functional operation of the first subsystem, storing the first valid functional codeword in a first memory in Block S120.

This variation of the method S100 further includes, during a second time period after the first time period, at the first controller, in response to detecting a match between contents of the first memory and the first valid functional codeword, outputting a first safety message including the second valid functional codeword in Block S130.

This variation of the method S100 further includes, during a third time period after the second time period, at the first controller, in response to detecting functional operation of the first subsystem, storing the first valid functional codeword in the first memory in Block S120.

This variation of the method S100 further includes, during a fourth time period after the third time period, at the first controller, in response to detecting a mismatch between contents of the first memory and every codeword in the first set of valid codewords, outputting a second safety message including the second valid fault codeword in Block S130.

1.3 Safety Module Timeout

As shown in FIGS. 1, 2A, and 2B, another variation of the method S100 includes, at a first controller in a first safety module coupled to a system, storing a first set of valid codewords in Block S110 including: a first valid functional codeword representing a functional timeout state of a second controller within the first safety module; a first valid fault codeword representing a fault timeout state of the second controller and characterized by a first minimum hamming distance from the first valid functional codeword; a second valid functional codeword representing a functional state of the second controller; a second valid fault codeword representing a fault state of the second controller and characterized by a second minimum hamming distance from the second valid functional codeword; a third valid functional codeword representing a functional state of a first input coupled to the system; a third valid fault codeword representing a fault state of the first input and characterized by a third minimum hamming distance from the third valid functional codeword; a fourth valid functional codeword representing a functional state of the system; and a fourth valid fault codeword representing a fault state of the system and characterized by a fourth minimum hamming distance from the fourth valid functional codeword.

This variation of the method S100 further includes, during a first time period, at the first controller: querying a first input register coupled to the second controller in Block S140; detecting, in the first input register, a first safety message including the second valid functional codeword from the second controller in Block S142; in response to detecting the first safety message in the first input register within a first time quantum, storing the first valid functional codeword in a first memory in Block S124; and in response to detecting functional operation of the first input, storing the third valid functional codeword in a second memory in Block S122.

This variation of the method S100 further includes, during a second time period following the first time period, at the first controller, in response to detecting a match between contents of the first memory and the first valid functional codeword, and in response to detecting functional operation of the first input, outputting a second safety message including the fourth valid functional codeword in Block S130.

This variation of the method S100 further includes, during a third time period following the second time period, at the first controller: querying the first input register in Block S140; detecting, in the first input register, a third safety message including the second valid functional codeword from the second controller in Block S142; in response to detecting the third safety message in the first input register within a second time quantum, storing the first valid functional codeword in the first memory in Block S124; and in response to detecting functional operation of the first input, storing the third valid functional codeword in the second memory in Block S122.

This variation of the method S100 further includes, during a fourth time period following the third time period, at the first controller, in response to detecting a mismatch between contents of the first memory and every codeword in the first set of valid codewords, outputting a fourth safety message including the fourth valid fault codeword in Block S130.

1.4 Safety Controller Timeout with External Input

As shown in FIGS. 1, 2A, and 2B, another variation of the method S100 includes, at a first controller in a first safety module coupled to a system, storing a first set of valid codewords in Block S110 including: a first valid functional codeword representing a functional timeout state of a second controller within a second safety module in the system; a first valid fault codeword representing a fault timeout state of the second controller and characterized by a first minimum hamming distance from the first valid functional codeword; a second valid functional codeword representing a functional state of the second controller; a second valid fault codeword representing a fault state of the second controller and characterized by a second minimum hamming distance from the second valid functional codeword; a third valid functional codeword representing a functional state of a first input coupled to the system; a third valid fault codeword representing a fault state of the first input and characterized by a third minimum hamming distance from the third valid functional codeword; a fourth valid functional codeword representing a functional state of the system; and a fourth valid fault codeword representing a fault state of the system and characterized by a fourth minimum hamming distance from the fourth valid functional codeword.

This variation of the method S100 further includes, during a first time period, at the first controller: in response to detecting a first safety message including the second valid functional codeword from the second controller within a first time quantum, storing the first valid functional codeword in a first memory in Block S126; and in response to detecting functional operation of the first input, storing the third valid functional codeword in a second memory in Block S122.

This variation of the method S100 further includes, during a second time period following the first time period, at the first controller, in response to detecting the second valid functional codeword in the first safety message, in response to detecting a match between contents of the first memory and the first valid functional codeword, and in response to detecting functional operation of the first input, outputting a second safety message including the fourth valid functional codeword in Block S130.

This variation of the method S100 further includes, during a third time period following the second time period, at the first controller: in response to detecting receipt of a third safety message including the second valid functional codeword from the second controller within a second time quantum, storing the first valid functional codeword in the first memory in Block S126; and in response to detecting functional operation of the first input, storing the third valid functional codeword in the second memory in Block S122.

This variation of the method S100 further includes, during a fourth time period following the third time period, at the first controller, in response to detecting a mismatch between contents of the first memory and every codeword in the first set of valid codewords, outputting a fourth safety message including the fourth valid fault codeword in Block S130.

1.5 Safety Controller Timeout

As shown in FIGS. 1, 2A, and 2B, another variation of the method S100 includes, at a first controller in a first safety module in a system, storing a set of valid codewords in Block S110 including: a first valid functional codeword representing a functional timeout state of a second controller within a second safety module in the system; a first valid fault codeword representing a fault timeout state of the second controller and characterized by a first minimum hamming distance from the first valid functional codeword; a second valid functional codeword representing a functional state of the system; and a second valid fault codeword representing a fault state of the system and characterized by a second minimum hamming distance from the second valid functional codeword.

This variation of the method S100 further includes, during a first time period, at the first controller, in response to detecting receipt of a first safety message from the second controller within a first time quantum, storing the first valid functional codeword in a memory in Block S126.

This variation of the method S100 further includes, during a second time period following the first time period, at the first controller, in response to detecting a match between contents of the memory and the first valid functional codeword, outputting a second safety message including the second valid functional codeword in Block S130.

This variation of the method S100 further includes, during a third time period following the second time period, at the first controller, in response to detecting receipt of a third safety message from the second controller within a second time quantum, storing the first valid functional codeword in the memory in Block S126.

This variation of the method S100 further includes, during a fourth time period following the third time period, at the first controller, in response to detecting a mismatch between contents of the memory and every codeword in the set of valid codewords, outputting a fourth safety message including the second valid fault codeword in Block S130.

2. Applications

Generally, the method S100 can be executed by a system to: store a set of valid codewords representing state information (e.g., functional, fault) for various components of a safety module (e.g., core infrastructure subsystems, input(s), data communication) and characterized by minimum hamming distances from other valid codewords; store codewords in memory based on detected states of core infrastructure subsystems, input(s), and/or data communication during a monitoring period; and output a safety message based on: (i) whether codewords stored in memory during the monitoring period match valid codewords, and (ii) the detected states during an evaluation period.

In particular, the method S100 can be executed by a safety module to encode state information as unique codewords exhibiting a certain minimum hamming distance from other codewords in the encoding scheme to mitigate instances of bit flips or software overwrites of state information stored in memory. For example, instances of unintentional bit flips or software overwrites may occur over time and through unpredictable modes, such as by bugs, lack of memory, malicious attacks, errant algorithm design, faulty memory, bit line errors, or alpha particle irradiation of memory, etc. The safety module can therefore execute Blocks of the method to detect a mismatch between encoded state information (e.g., codewords) stored in memory and the encoding scheme (e.g., valid codewords), which indicates that the encoded state information has been overwritten, and to selectively execute fault, alerting, and/or fault recovery processes accordingly.

In one example, a safety module executes Blocks of the method S100 to: store valid codewords representing functional states of individual subsystems of controllers within the safety module, a functional state of an external input monitored by the safety module, and/or a functional state for data communication and characterized by minimum hamming distances from other valid codewords. The safety module also executes Blocks of the method S100 to: detect functional states of the individual subsystems, the external input, and/or the data communication; and store corresponding codewords in memory. The safety module then executes Blocks of the method S100 to: detect a match between stored codewords and valid codewords; and output a safety message indicating a functional state in response to detecting this match. Therefore, when implemented in an environment prone to interference, the safety module can output safety messages exhibiting a low error rate and can meet functional safety standards.

Alternatively, in this example, if the safety module detects a mismatch between stored codewords and valid codewords, the safety module can output a safety message indicating a fault state. Therefore, because the safety module validates the state of each subsystem based on alignment of stored codewords and valid codewords that encode functional states of these subsystems, the safety module can: detect a fault based on a difference between stored codewords and valid codewords; transmit a fault message in place of a functional message in response to detecting a fault, thereby triggering the system to enter a safe mode with fault condition when function of the safety module is thus unverifiable.

In another example, a safety module executes Blocks of the method S100 to store valid codewords representing states (e.g., functional state, fault state) of individual subsystems within a controller within the safety module, a state(s) of an external input(s) monitored by the safety module, and/or a state(s) for data communication and characterized by minimum hamming distances from other valid codewords. The safety module also executes Blocks of the method S100 to: detect states of the individual subsystems, the external input, and/or the data communication; and store codewords corresponding to the detected states in memory. The safety module then executes Blocks of the method S100 to: output a safety message including a codeword representing an overall state (e.g., functional state, fault state) of the controller(s), input(s), and/or data communication based on: (i) whether codewords stored in memory during the monitoring period match valid codewords; and (ii) the detected states. Therefore, when the safety module is implemented in a system requiring continuous communication with a large number of nodes (e.g., inputs, machines, etc.), the safety module can: manage message traffic from the subgroup of nodes; and transmit a message indicating an overall state of the subgroup, thereby streamlining communication and maintaining functional safety standards in large networks.

The method S100 as described herein is executed by a safety module containing a pair of controllers (e.g., microcontrollers manufactured according to 90-nanometer chip manufacturing technologies) and an application processor to implement 8-bit and 16-bit codewords. However, a safety module containing additional or fewer controllers, connected to an external logic, and/or manufactured via any other fabrication technology can similarly execute Blocks of the method S100 to: store a set of valid codewords representing state information (e.g., functional, fault) for various components of a safety module (e.g., core infrastructure subsystems, input(s), data communication) and characterized by minimum hamming distances from other codewords; during a monitoring period, store codewords in memory based on detected states of core infrastructure subsystems, input(s), and/or data communication; and, during an evaluation period, output a safety message based on: (i) whether codewords stored in memory during the monitoring period match valid codewords, and (ii) the detected states.

Furthermore, the method S100 as described herein is executed by a safety module containing a pair of controllers and an application processor to implement 8-bit and 16-bit codewords separated by predefined minimum hamming distances (e.g., a minimum hamming distance of "8" or "4"). However, a safety module implementing longer or shorter codewords separated by larger or smaller minimum hamming distances from each other can similarly execute Blocks of the method S100 to: store a set of valid codewords representing state information (e.g., functional, fault) for various components of a safety module (e.g., core infrastructure subsystems, input(s), data communication) and characterized by minimum hamming distances from other codewords; during a monitoring period, store codewords in memory based on detected states of core infrastructure subsystems, input(s), and/or data communication; and, during an evaluation period, output a safety message based on: (i) whether codewords stored in memory during the monitoring period match valid codewords, and (ii) the detected states.

3. System

Generally, a safety module includes: a first controller, a second controller, an application processor, and a communication bus. The communication bus supports two-way communication between the first controller and the second controller, two-way communication between the first controller and the application controller, and two-way communication between the second controller and the application controller.

In particular, the first controller executes Blocks of the method S100 to: store a first set of valid codewords; store codewords in memory corresponding to detected states; and output safety messages including codewords representing state (e.g., functional state, fault state) based on the detected states in response to detecting a match between the codewords stored in memory and the set of valid codewords. The first controller also executes Blocks of the method S100 to: output safety messages including codewords representing fault state in response to detecting a mismatch between the codewords stored in memory and the set of valid codewords.

Similarly, the second controller executes Blocks of the method S100 to: store a second set of valid codewords; store codewords in memory corresponding to detected states; and output safety messages including codewords representing state (e.g., functional state, fault state) based on the detected states in response to detecting a match between the codewords stored in memory and the set of valid codewords. The second controller also executes Blocks of the method S100 to: output safety messages including codewords representing fault state in response to detecting a mismatch between the codewords stored in memory and the set of valid codewords Furthermore, the application processor executes Blocks of the method S100 to: transmit/receive safety messages to/from the first controller; transmit/receive safety messages to/from the second controller; and transmit/receive safety messages to/from other safety modules.

3.1 First Controller

In one implementation, the first controller includes: an arithmetic logic unit (hereinafter "ALU"); volatile memory (e.g., random access memory or "RAM"); and non-volatile memory (e.g., flash memory). The ALU executes arithmetic and logic operations based on computer instructions executed by the first controller. The RAM temporarily stores data retrieved from storage for performing calculations. The flash memory stores data and instructions that are programmed into the first controller. The first controller can further include an input/output interface, an internal bus, and an internal oscillator. The first controller may include fewer or additional components.

In one variation, the first controller further includes a program flow monitor safety mechanism, a stack underflow safety monitor, and a stack overflow safety monitor.

Generally, the program flow monitor safety mechanism detects errors in ordering or other flows of a software instruction being executed by the first controller. In one implementation, the program flow monitor safety mechanism exhibits fault operation when such errors are detected.

Generally, the stack overflow safety mechanism detects a software program being executed by the first controller attempting to use more space than is available on a call stack. In one implementation, the stack overflow safety mechanism exhibits fault operation when stack overflow is detected.

Generally, the stack underflow safety mechanism detects a software program being executed by the controller attempting to remove an item from an empty stack in memory. In one implementation, the stack underflow safety mechanism exhibits fault operation when stack underflow is detected.

In one implementation, the first controller includes an input configured to connect to a safety sensor (e.g., an emergency stop button, a line break sensor) external to the safety module.

In one implementation, the first controller includes an input coupled to an output of the second controller. For example, the first controller can include an input register coupled to an output of the second controller.

3.1.1 First Controller: Logic

Generally, the first controller includes logic (e.g., hardware and/or firmware modules, instructions stored in the flash memory) configured to detect states of: a set of subsystems within the first controller; the input configured to connect to a safety sensor; and the input coupled to the second controller. For example, the set of subsystems within the first controller can include the ALU, the RAM, the flash memory, the program flow monitor safety mechanism, the stack overflow safety mechanism, and/or the stack underflow safety mechanism.

In one implementation, the first controller can include logic by which the first controller individually monitors each subsystem in the set of subsystems and detects operation (e.g., functional operation, fault operation) of each subsystem accordingly, as described below. In one example, the first controller can monitor the ALU and detect functional operation of the ALU based on a diagnostic test of the ALU. In another example, the first controller can monitor the stack overflow safety mechanism and detect fault operation of the stack overflow safety mechanism in response to/based on an instance of stack overflow.

In another implementation, the first controller detects functional operation in an absence of errors detected for a given subsystem, and the first controller detects fault operation when one or more errors are detected for the given subsystem. For example, an error may be defined based on nature of the given subsystem, a safety standard associated with the given subsystem, and/or any factor applicable to the given subsystem.

In another implementation, the first controller detects a state of a subsystem corresponding to the detected operation of the subsystem. In one example, the first controller detects a functional state of the ALU in response to detecting functional operation of the ALU. In another example, the first controller detects a fault state of the stack overflow safety mechanism in response to detecting fault operation of the stack overflow safety mechanism.

In another implementation, the first controller further includes logic that enables the first controller to detect a state of an input configured to connect to a safety sensor as described below. For example, the first controller can detect functional operation of the input (e.g., an input circuit coupled to an emergency stop button is operating within correct voltage/current ranges according to a configured mode of operation, etc.), and then the first controller can detect a functional state of the input in response to detecting functional operation of the input. Alternatively, the first controller can detect fault operation of the input (e.g., the input circuit coupled to the emergency stop button is operating outside of the correct voltage/current ranges according to the configured mode of operation, an internal hardware fault, etc.), and then the first controller can detect a fault state of the input in response to detecting fault operation of the input.

In another implementation, the first controller further includes logic that enables the first controller to detect states of the second controller as described below. In one example, the first controller can detect a functional timeout state of the second controller in response to detecting receipt of a safety message from the second controller within a predefined time quantum. Alternatively, the first controller can detect a fault timeout state of the second controller in response to detecting non-receipt of a safety message from the second controller within the predefined time quantum. In another example, the first controller can detect a functional state or a fault state of the second controller based on contents of the safety message from the second controller.

In one variation, the first controller includes: a communication infrastructure safety mechanism and a communicated content safety mechanism to detect communication faults with the second controller and/or the application processor.

Similarly, in another implementation, the first controller further includes logic that enables the first controller to detect states of other controllers within other safety modules as described below.

In another implementation, the first controller further includes logic that enables the first controller to encode the detected states of the second controller as described below. For example, the first controller can store codewords corresponding to the detected states in memory (e.g., flash memory, external memory).

In another implementation, the first controller further includes logic that enables the first controller to detect whether memory contents match valid codewords as described below. For example, the first controller can detect a match between memory contents and a valid codeword, indicating the codeword stored in memory has not been overwritten. Alternatively, the first controller can detect a mismatch between memory contents and every valid codeword, indicating the codeword stored in memory has been overwritten.

In another implementation, the first controller further includes logic that enables the first controller to output safety messages as described below. For example, the first controller can assemble and output safety messages to the second controller and/or the application processor via the communication bus.

3.2 Second Controller

In one implementation, the second controller: includes analogous (e.g., similar, identical) components arranged in an analogous format as the first controller; and is separate and discrete from the first controller.

In one example, the first controller and the second controller each include a redundant input configured to be connected to the same safety sensor (e.g., two redundant outputs of an emergency stop button, outputs of two redundant line break sensors). The first controller and the second controller independently process each redundant input and produce discrete safety messages.

3.3 Application Processor

In one implementation, the application processor is configured to: receive safety messages from the first controller and the second controller; concatenate information in the safety messages from the first controller and the second controller into a new safety message; and output the new safety message (e.g., over a network to another safety module).

In another implementation, the application processor is further configured to: receive safety messages (e.g., over the network from another safety module); separate the information within the received safety messages into a first safety message for the first controller, and a second safety message for the second controller; output the first safety message to the first controller; and output the second safety message to the second controller.

In another implementation, communication through the application processor by the first controller and the second controller are implemented in a black channel setup where the application processor concatenates/separates information passed between the underlying controllers without otherwise analyzing or manipulating that data.

In one variation, the application processor is configured to: analyze a first safety message from the first controller and a second safety message from the second controller; and output a new safety message based on a result of the analysis. In one example, the application processor can output a safety message indicating a functional state in response to receiving: a first safety message indicating a functional state from the first controller; and a second safety message indicating a functional state from the second controller. In another example, the application processor can output a safety message indicating a fault state in response to receiving: a first safety message indicating a functional state from the first controller; and a second safety message indicating a fault state from the second controller.

4. Example 1: Emergency Stop Button

Generally, a safety module transmits safety messages and receives safety messages. One or more safety modules can be implemented within a given machine. A safety message can indicate a (e.g., functional, safe, safe due to fault) of a machine (or module or subcomponent thereof), and a safety message can command a machine to enter a safe state (e.g., stop performing a given task, disengage a fuel supply, shut down, reboot) to prevent unsafe activity until the safe state can be reconciled.

In one example, as shown in FIGS. 2A and 2B, a system includes: a safety module; and a safety controller.

As described above, in one implementation, the safety module includes: a first controller; a second controller; an application processor; and a communication bus. The first controller includes a first input coupled to an emergency stop button within the system, and the second controller includes a second input coupled to the emergency stop button.

Generally, the first controller and the second controller independently process their respective input coupled to the emergency stop button and output respective safety messages to the application processor. In particular, the first controller can output a first safety message based on a detected state of the first controller (e.g., based on detected states of the set of subsystems within the first controller), a detected state of the first input, a detected state of the second controller, and validity of stored codewords representing the detected states (e.g., detecting matches between stored codewords and valid codewords). For example, the first controller can output the first safety message to the second controller and/or the application processor via the communication bus.

Similarly, the second controller can output a second safety message based on a detected state of the second controller (e.g., based on detected states of the set of subsystems within the second controller), a detected state of the second input, a detected state of the first controller, and validity of stored codewords representing the detected states (e.g., detecting matches between stored codewords and valid codewords). For example, the second controller can output the second safety message to the first controller and/or the application processor via the communication bus.

In one implementation, the application processor within the safety module receives the first safety message and the second safety message, concatenates the first safety message and the second safety message, and outputs the resultant safety message to the application processor within the safety controller. For example, the application processor can transmit the resultant safety message over a transmission medium (e.g., any network, the Internet, WiFi, Bluetooth, LTE).

In one implementation, the application processor within the safety controller receives the safety message from the application processor within the safety module and separates the received safety message into: the first safety message for the first controller within the safety controller; and the second safety message for the second controller within the safety controller. The application processor within the safety controller then: outputs the first safety message to the first controller within the safety controller via the communication bus; and outputs the second safety message to the second controller within the safety controller via the communication bus. Therefore, the first controller within the safety controller can process the first safety message from the first controller within the safety module, and the second controller within the safety controller can process the second safety message from the second controller within the safety module.

In one example, the first controller and the second controller within the safety module generate and output safety messages based on the first input and the second input indicating a fault state (e.g., an input circuit coupled to the emergency stop button is operating outside of the correct voltage/current ranges according to the configured mode of operation, an internal hardware fault, etc.). The safety messages include codewords representing fault states of the respective inputs. The safety messages are passed to the safety controller and processed by the first controller and the second controller within the safety controller. The first controller and the second controller within the safety controller can agree on a fault state of the first input and the second input (e.g., the emergency stop button coupled to the safety module). The first controller and the second controller within the safety controller can then output safety messages commanding a machine to enter a safe state. Further description of implementing two controllers to meet this threshold is further described in U.S. patent application Ser. No. 17/192,657, filed on 4 Mar. 2021, which is incorporated in its entirety by this reference.

5. Example 2: Zone Controller

In one variation to the above example, as shown in FIGS. 2A and 2B, the system includes: safety modules; safety controllers; and a zone controller.

Generally, a safety controller is a safety module configured to: receive safety messages from a group of safety modules; and transmit safety messages to the group of safety modules.

In one implementation, the safety controller 110 is configured to: receive safety messages from the safety module 120 and the safety module 122; and transmit safety messages to the safety module 120 and the safety module 122. For example, the safety controller can, upon occurrence of a condition (e.g., a given machine has entered a safe state; a given command is received that affects multiple machines), command predefined segments of other machines to change safety state (e.g., enter a safe state).

Similarly, the safety controller 112 approximates the safety controller 110. For example, the safety controller 112 is configured to: receive safety messages from the safety module 124 and the safety module 126; and transmit safety messages to the safety module 124 and the safety module 126.

In one variation of this example, the number of safety modules in a group of safety modules can be greater or fewer. Additionally or alternatively, safety modules can be dynamically assigned to different groups of safety modules.

Generally, a zone controller is a safety module configured to: receive safety messages from a group of safety controllers and/or safety modules; and transmit safety messages to a group of safety controllers and/or safety modules. For example, a zone controller can transmit safety messages across a "zone," which may be a logical sub-grouping of machines in a facility.

In one implementation, the zone controller 130 is configured to: receive safety messages from the safety controller 110 and the safety controller 112; and transmit safety messages to the safety controller 110 and the safety controller 112. Additionally or alternatively, the zone controller 130 is further configured to: receive safety messages from the safety modules 120, 122, 124, 126; and transmit safety messages to the safety modules 120, 122, 124, 126.

In one variation to this example, zone groupings may cascade to any number of tiers where zone controllers may interact with yet another controller that may be configured to transmit safety messages to all machines of an entire facility (e.g., an emergency facility-wide shutdown). In this variation, mapping tables or other logical associations can be used, where conditions, types of commands or states, or other triggers may be mapped to downstream machines and controllers that should receive commands when a condition is met.

In yet another variation to this example, each layer in the system can implement a timeout safety system. For example, the communication between a safety module 120 and a safety controller no is an example layer of communication. Furthermore, the communication a safety controller 110 and a zone controller 130 is another layer of communication. In this two-layer example, a safety controller 110 monitors the timeout states of the safety modules 120, 122, and the zone controller 130 monitors the timeout states of the safety controllers 110, 112. In one variation, there can be additional layers beyond either end of the system shown in FIGS. 2A and 2B.

In this example, a receiving module (e.g., safety controller, zone controller) stores the timeout states of a plurality of transmitting modules (e.g., safety module, safety controller) and uses the timeout states to determine safety remedy when one or more transmitting modules shows faulty timeout states. For example, if only a single transmitting module in a group shows fault, the receiving module can flag the faulty transmitting module for inspection. In other cases, if more than a threshold number of transmitting modules become faulty, the receiving module can take a more aggressive measure, such as commanding one or more receiving modules into a safe mode or even shutting down a part or the entirety of the system. The timeout states of transmitting modules are stored in a memory associated with the receiving module for further analysis to determine a safety action and remedy that a system may take when one or more modules become faulty.

In yet another variation to this example, the zone controller 130 receives a safety message including one or more valid fault codewords (e.g., from the safety controller 110), decodes the safety message, interprets the one or more valid fault codewords as a system fault, and provides notification for a recovery mode.

6. Safety Messages

Figure 3:
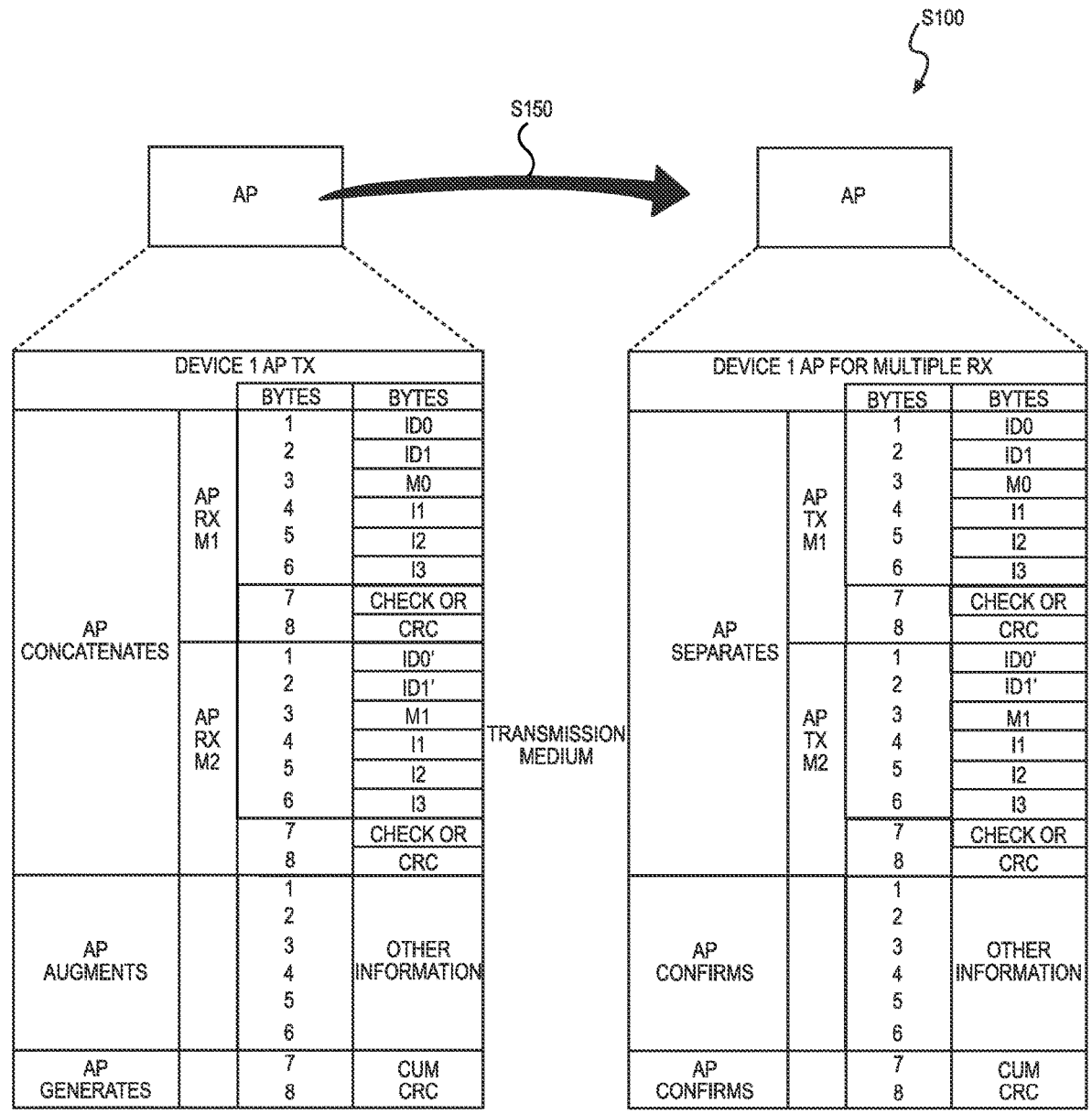
FIG. 3 is a schematic representation of one variation of the method.

In one example, the application processor transmits a concatenated safety message, as shown in FIG. 3.

Generally, the application processor concatenates information from the first controller and the second controller. In one implementation, "AP Rx M1" refers to information the application processor received from the first controller, and "AP Rx M2" refers to information the application processor received from the second controller. In one variation, the application processor can concatenate information from additional or fewer controllers into the safety message.

In one implementation, the first two bytes of the safety message (e.g., "ID0," "ID1;" "ID0'," "ID1'") include bytes that, together, uniquely identify the controller. The third byte of the safety message (e.g., "M0," "M1") refers to a state of the controller (e.g., functional state, fault state). In one implementation, the first controller generates the third byte ("M0") after detecting a state of the first controller, as described below. Similarly, the second controller generates the third byte ("M1") after detecting a state of the second controller.

In one implementation, the fourth through sixth bytes (e.g., "I1", "I2", "I3") refer to one or more inputs received by the first controller and the second controller (e.g., emergency stop button, line break sensor). In one variation, any order of bytes may be used.

In one implementation, the application processor concatenates the safety messages from the first controller and the second controller, as well as an error code (e.g., cyclic redundancy check (CRC) code). Further information about appending one or more error codes to safety data of two or more microcontrollers and decode/verify safety messages using the same is also described with reference to U.S. patent application Ser. No. 17/192,657, filed on 4 Mar. 2021, which is incorporated in its entirety by this reference.

In one implementation, the application processor may augment the data of the controllers with other information, and may generate a cumulative error code (e.g., cumulative CRC) for the message in its entirety.

In one implementation, the application processor of the input device transmits the safety message, after it is concatenated, to the receiving device (e.g., safety controller), which decodes the message. On the receiving side, the application processor (e.g., of safety controller) separates the messages from each controller. Where M0 or M1 indicate a fault state, all of inputs I1-I3 are failed. Systems and methods for decoding the message while ensuring functional safety standards are described with reference to U.S. patent application Ser. No. 17/192,657, filed on 4 Mar. 2021, which is incorporated in its entirety by this reference.

7. Storing Valid Codewords

Block S110 of the method S100 recites: storing a first set of valid codewords including: a first valid functional codeword representing a functional state of a first subsystem of a first set of subsystems within the first controller; a first valid fault codeword representing a fault state of the first subsystem and characterized by a first minimum hamming distance from the first valid functional codeword; a second valid functional codeword representing a functional state of the first controller; a second valid fault codeword representing a fault state of the first controller and characterized by a second minimum hamming distance from the second valid functional codeword; a third valid functional codeword representing a functional state of a first input coupled to the system; a third valid fault codeword representing a fault state of the first input and characterized by a third minimum hamming distance from the third valid functional codeword; a fourth valid functional codeword representing a functional state of the system; and a fourth valid fault codeword representing a fault state of the system and characterized by a fourth minimum hamming distance from the fourth valid functional codeword.

Generally, in Block S110, the first controller stores a first set of valid codewords representing states of subsystems within the first controller, an input(s) monitored by the first controller, and data communication involving the first controller. In particular, a valid codeword is a bit pattern uniquely representing a state and characterized by a minimum hamming distance from other valid codewords as described below.

Similarly, in Block S110, the second controller stores a second set of valid codewords representing states of subsystems within the second controller, an input(s) monitored by the second controller, and data communication involving the second controller.

In one implementation, the first controller can store the first set of valid codewords in the flash memory within the first controller. In one variation, the first controller can store the first set of valid codewords in an external memory. In yet another example, the first controller can store different valid codewords in the first set of valid codewords across different memories.

Similarly, in one implementation, the second controller can store the second set of valid codewords in the flash memory within the second controller. In one variation, the second controller can store the second set of valid codewords in an external memory. In yet another example, the second controller can store different valid codewords in the second set of valid codewords across different memories.

In one variation, the first controller stores every valid codeword stored and/or implemented by any other controller in communication with the first controller. Similarly, the second controller stores every valid codeword stored and/or implemented by any other controller in communication with the first controller. Therefore, the first controller can validate codewords included in safety messages received from the other controllers, as described below. In another variation, the first controller and the second controller can store a greater or fewer number of valid codewords.

7.1 Storing Valid Codewords: First Controller Subsystems

Generally, in Block S110, the first controller stores, for each subsystem in a set of a subsystems within the first controller: a respective valid functional codeword representing a functional state of the subsystem; and a respective valid fault codeword representing a fault state of the subsystem. In one example, the first controller can store: a valid functional codeword representing a functional state of the ALU; and a valid fault codeword representing a fault state of the ALU. In another example, the first controller can store: a valid functional codeword representing a functional state of the flash memory within the first controller; and a valid fault codeword representing a fault state of the ALU. In yet another example, the first controller can store: a valid functional codeword representing a functional state of the stack overflow safety mechanism; and a valid fault codeword representing a fault state of the stack overflow safety mechanism.

In one implementation, the first controller stores each valid codeword representing a state of its subsystems as a different bit pattern exhibiting a length of 16 bits (e.g., one word, two bytes, four nibbles). Each 16-bit word includes an upper byte and a lower byte. Each byte includes an upper nibble and a lower nibble.

In one example, the first controller can store a valid functional codeword representing a functional state of the ALU within the first controller as "13, 14, 14, 13" (expressed in binary as "1101111011101101"). The upper nibble of the upper byte is "13" (expressed in binary as "1101") and the lower nibble of the upper byte is "14" (expressed in binary as "1110"). Likewise, the upper nibble of the lower byte is "14" (expressed in binary as "1110") and the lower nibble of the lower byte is "13" (expressed in binary as "1101"). The upper byte and the lower byte exhibit inverse nibble values to each other (e.g., "13, 14" versus "14, 13").

In another example, the first controller can store a valid fault codeword representing a fault state of the ALU within the first controller as "8, 2, 2, 8" (expressed in binary as "1000001000101000"). The upper nibble of the upper byte is "8" (expressed in binary as "1000") and the lower nibble of the upper byte is "2" (expressed in binary as "0010"). Likewise, the upper nibble of the lower byte is "2" (expressed in binary as "0010") and the lower nibble of the lower byte is "8" (expressed in binary as "1000"). The upper byte and the lower byte exhibit inverse nibble values to each other (e.g., "8, 2" versus "2, 8").

In one implementation, the first controller stores valid codewords including only odd values (e.g., every half byte is an odd value). In one variation, the first controller stores valid codewords including only even values (e.g., every half byte is an even value). In another variation, the first controller stores valid codewords characterized by: the upper byte of a valid fault codeword uses only odd values; the lower byte of a valid fault codeword uses only even values; the upper byte of a valid functional codeword uses only even values; and the lower byte of a valid functional codeword uses only odd values. In yet another variation, the first controller stores valid codewords characterized by: the upper byte of a valid fault codeword uses only even values; the lower byte of a valid fault codeword uses only odd values; the upper byte of a valid functional codeword uses only odd values; and the lower byte of a valid functional codeword uses only even values. "Odd" and "even" here describe the number of bits instead of an odd or even value of the decimal number.

In one implementation, the first controller stores a valid functional codeword for a given subsystem within the first controller and a valid fault codeword for the given subsystem mutually characterized by a minimum hamming distance of 8 from each other. In the above example, the valid functional codeword representing a functional state of the ALU (e.g., "1101111011101101") and the valid fault codeword representing a fault state of the ALU (e.g., "10000010000101000") are characterized by a hamming distance of 8 from each other. In one variation, the first controller can store a valid functional codeword for a given subsystem and a valid fault codeword for the given subsystem mutually characterized by a hamming distance of greater than 8 from each other.

In one implementation, the first controller stores a valid functional codeword for a given subsystem within the first controller and a valid functional codeword for a different subsystem within the first controller mutually characterized by a minimum hamming distance of 4 from each other.

In one implementation, the first controller stores a valid functional codeword for a given subsystem within the first controller and a valid fault codeword for a different subsystem within the first controller mutually characterized by a minimum hamming distance of 4 from each other.

In one implementation, the first controller stores a valid fault codeword for a given subsystem within the first controller and a valid functional codeword for a different subsystem within the first controller mutually characterized by a minimum hamming distance of 4 from each other.

In one implementation, the first controller stores a valid fault codeword for a given subsystem within the first controller and a valid fault codeword for a different subsystem within the first controller mutually characterized by a minimum hamming distance of 4 from each other.

In one variation of the above example, the first controller can further store: a valid functional codeword representing a functional state of the flash memory within the first controller as "14, 13, 13, 14" (expressed in binary as "1110110111011110"); and a valid fault codeword representing a fault state of the flash memory within the first controller as "2, 8, 8, 2" (expressed in binary as "0010100010000010").

In the above example, the valid functional codeword representing a functional state of the ALU (e.g., "1101111011101101") and the valid functional codeword representing a functional state of the flash memory (e.g., "1110110111011110") are characterized by a minimum hamming distance of 4 from each other (e.g., a hamming distance of 8 in this case).

In the above example, the valid functional codeword representing a functional state of the ALU (e.g., "1101111011101101") and the valid fault codeword representing a fault state of the flash memory (e.g., "0010100010000010") are characterized by a minimum hamming distance of 4 from each other (e.g., a hamming distance of 8 in this case).

In the above example, the valid fault codeword representing a fault state of the ALU (e.g., "10000010000101000") and the valid functional codeword representing a functional state of the flash memory (e.g., "1110110111011110") are characterized by a minimum hamming distance of 4 from each other (e.g., a hamming distance of 12 in this case).

In the above example, the valid fault codeword representing a fault state of the ALU (e.g., "10000010000101000") and the valid fault codeword representing a fault state of the flash memory (e.g., "0010100010000010") are characterized by a minimum hamming distance of 4 from each other (e.g., a hamming distance of 8 in this case).

Therefore, the first controller can store valid codewords characterized by sufficiently large minimum hamming distances to detect occurrences of bit flips or software overwrites.

7.2 Storing Valid Codewords: Second Controller Subsystems

Generally, in Block S110, the second controller stores, for each subsystem in a set of a subsystems within the second controller: a respective valid functional codeword representing a functional state of the subsystem; and a respective valid fault codeword representing a fault state of the subsystem.

In one implementation, the second controller stores: a valid functional codeword for a given subsystem within the second controller and a valid fault codeword for the given subsystem within the second controller mutually characterized by a minimum hamming distance of 8 from each other; a valid functional codeword for a given subsystem within the second controller and a valid functional codeword for a different subsystem within the second controller mutually characterized by a minimum hamming distance of 4 from each other; a valid functional codeword for a given subsystem within the second controller and a valid fault codeword for a different subsystem within the second controller mutually characterized by a minimum hamming distance of 4 from each other; a valid fault codeword for a given subsystem within the second controller and a valid functional codeword for a different subsystem within the second controller mutually characterized by a minimum hamming distance of 4 from each other; and a valid fault codeword for a given subsystem within the second controller and a valid fault codeword for a different subsystem within the second controller mutually characterized by a minimum hamming distance of 4 from each other.

In one implementation, the second controller stores a valid functional codeword for a given subsystem within the second controller characterized by a minimum hamming distance of 8 from a valid functional codeword for an analogous subsystem within the first controller.

In a variation of an above example, the second controller can store a valid functional codeword representing a functional state of the ALU within the second controller "14, 13, 13, 14" (expressed in binary as "1110110111011110"). The valid functional codeword representing a fault state of the ALU in the second controller (e.g., "1110110111011110")

and the valid functional codeword representing a functional state of the ALU in the first controller (e.g., "1101111011101101") are characterized by a minimum hamming distance of 8 from each other (e.g., a hamming distance of 8 in this case).

Similarly, in one implementation, the second controller stores a valid fault codeword for a given subsystem within the second controller characterized by a minimum hamming distance of 8 from a valid fault codeword for an analogous subsystem within the first controller.

7.2.1 Storing Valid Codewords: Subsystems Example

In one example, the first controller (shown as "MA" in FIG. 3) and the second controller (shown as "MB" in FIG. 3) can each store codewords as shown in FIG. 3.

In one example, the first controller stores the binary value pairs below characterized by a hamming distance equal to or greater than 8 to each other. The pairs include: No Failure Indicators (NFI) (e.g., valid functional codewords) and Failure Indicators (FI) (e.g., valid fault codewords) for Safety Mechanisms [SM] within the first controller: ALU/Core SM NFI to FI; Program Flow Monitor SM NFI to FI; RAM SM NFI to FI; Flash SM NFI to FI; Stack Underflow SM NFI to FI; and Stack Overflow SM NFI to FI.

In another example, the first controller stores NFI (e.g., valid functional codewords) within the first controller characterized by a hamming distance equal to or greater than 4 to each other. The pairs include: ALU/Core SM NFI to Program Flow Monitor SM NFI; ALU/Core SM NFI to RAM SM NFI; ALU/Core SM NFI to Flash SM NFI; ALU/Core SM NFI to Stack Underflow SM NFI; ALU/Core SM NFI to Stack Overflow SM NFI; Program Flow Monitor SM NFI to RAM SM NFI; Program Flow Monitor SM NFI to Flash SM NFI; Program Flow Monitor SM NFI to Stack Underflow SM NFI; Program Flow Monitor SM NFI to Stack Overflow SM NFI; RAM SM NFI to Flash SM NFI; RAM SM NFI to Stack Underflow SM NFI; RAM SM NFI to Stack Overflow SM NFI; Flash SM NFI to Stack Underflow SM NFI; Flash SM NFI to Stack Overflow SM NFI; and Flash SM NFI to Stack Overflow SM NFI.

In yet another example, the first controller stores FI (e.g., valid fault codewords) within the first controller characterized by a hamming distance equal to or greater than 4 to each other. The pairs include ALU/Core SM FI to Program Flow Monitor SM FI; ALU/Core SM FI to RAM SM FI; ALU/Core SM FI to Flash SM FI; ALU/Core SM FI to Stack Underflow SM FI; ALU/Core SM FI to Stack Overflow SM FI; Program Flow Monitor SM FI to RAM SM FI; Program Flow Monitor SM FI to Flash SM FI; Program Flow Monitor SM FI to Stack Underflow SM FI; Program Flow Monitor SM FI to Stack Overflow SM FI; RAM SM FI to Flash SM FI; RAM SM FI to Stack Underflow SM FI; RAM SM FI to Stack Overflow SM FI; Flash SM FI to Stack Underflow SM FI; Flash SM FI to Stack Overflow SM FI; and Flash SM FI to Stack Overflow SM FI.

In yet another example, the first controller stores NFI (e.g., valid functional codewords) and other FI (e.g., valid fault codewords) within the first controller characterized by a hamming distance equal to or greater than 4 to each other. The pairs include ALU/Core SM NFI to Program Flow Monitor SM FI; ALU/Core SM NFI to RAM SM FI; ALU/Core SM NFI to Flash SM FI; ALU/Core SM NFI to Stack Underflow SM FI; ALU/Core SM NFI to Stack Overflow SM FI; Program Flow Monitor SM NFI to RAM SM FI; Program Flow Monitor SM NFI to Flash SM FI; Program Flow Monitor SM NFI to Stack Underflow SM FI; Program Flow Monitor SM NFI to Stack Overflow SM FI; RAM SM NFI to Flash SM FI; RAM SM NFI to Stack Underflow SM FI; RAM SM NFI to Stack Overflow SM FI; Flash SM NFI to Stack Underflow SM FI; Flash SM NFI to Stack Overflow SM FI; and Flash SM NFI to Stack Overflow SM FI.

In yet another example, the first controller stores FI (e.g., valid fault codewords) and other NFI (e.g., valid functional codewords) within the first controller characterized by a hamming distance equal to or greater than 4 to each other. The pairs include ALU/Core SM FI to Program Flow Monitor SM NFI; ALU/Core SM FI to RAM SM NFI; ALU/Core SM FI to Flash SM NFI; ALU/Core SM FI to Stack Underflow SM NFI; ALU/Core SM FI to Stack Overflow SM NFI; Program Flow Monitor SM FI to RAM SM NFI; Program Flow Monitor SM FI to Flash SM NFI; Program Flow Monitor SM FI to Stack Underflow SM NFI; Program Flow Monitor SM FI to Stack Overflow SM NFI; RAM SM FI to Flash SM NFI; RAM SM FI to Stack Underflow SM NFI; RAM SM FI to Stack Overflow SM NFI; Flash SM FI to Stack Underflow SM NFI; Flash SM FI to Stack Overflow SM NFI; and Flash SM FI to Stack Overflow SM NFI.

In yet another example, the second controller stores the binary value pairs below characterized by a hamming distance equal to or greater than 8 to each other. The pairs include No Failure Indicators (NFI) (e.g., valid functional codewords) and Failure Indicators (FI) (e.g., valid fault codewords) for Safety Mechanisms [SM] within the second controller: ALU/Core SM NFI to FI; Program Flow Monitor SM NFI to FI; RAM SM NFI to FI; Flash SM NFI to FI; Stack Underflow SM NFI to FI; and Stack Overflow SM NFI to FI.

In yet another example, the second controller stores NFI (e.g., valid functional codewords) within the second controller characterized by a hamming distance equal to or greater than 4 to each other. The pairs include ALU/Core SM NFI to Program Flow Monitor SM NFI; ALU/Core SM NFI to RAM SM NFI; ALU/Core SM NFI to Flash SM NFI; ALU/Core SM NFI to Stack Underflow SM NFI; ALU/Core SM NFI to Stack Overflow SM NFI; Program Flow Monitor SM NFI to RAM SM NFI; Program Flow Monitor SM NFI to Flash SM NFI; Program Flow Monitor SM NFI to Stack Underflow SM NFI; Program Flow Monitor SM NFI to Stack Overflow SM NFI; RAM SM NFI to Flash SM NFI; RAM SM NFI to Stack Underflow SM NFI; RAM SM NFI to Stack Overflow SM NFI; Flash SM NFI to Stack Underflow SM NFI; Flash SM NFI to Stack Overflow SM NFI; and Flash SM NFI to Stack Overflow SM NFI.

In yet another example, the second controller stores FI (e.g., valid fault codewords) within the second controller characterized by a hamming distance equal to or greater than 4 to each other. The pairs include ALU/Core SM FI to Program Flow Monitor SM FI; ALU/Core SM FI to RAM SM FI; ALU/Core SM FI to Flash SM FI; ALU/Core SM FI to Stack Underflow SM FI; ALU/Core SM FI to Stack Overflow SM FI; Program Flow Monitor SM FI to RAM SM FI; Program Flow Monitor SM FI to Flash SM FI; Program Flow Monitor SM FI to Stack Underflow SM FI; Program Flow Monitor SM FI to Stack Overflow SM FI; RAM SM FI to Flash SM FI; RAM SM NFI to Stack Underflow SM FI; RAM SM FI to Stack Overflow SM FI; Flash SM FI to Stack Underflow SM FI; Flash SM FI to Stack Overflow SM FI; and Flash SM FI to Stack Overflow SM FI.

In yet another example, the second controller stores NFI (e.g., valid functional codewords) and other Failure Indicators FI within the second controller characterized by a hamming distance equal to or greater than 4 to each other. The pairs include ALU/Core SM NFI to Program Flow Monitor SM FI; ALU/Core SM NFI to RAM SM FI; ALU/Core SM NFI to Flash SM FI; ALU/Core SM NFI to Stack Underflow SM FI; ALU/Core SM NFI to Stack Overflow SM FI; Program Flow Monitor SM NFI to RAM SM FI; Program Flow Monitor SM NFI to Flash SM FI; Program Flow Monitor SM NFI to Stack Underflow SM FI; Program Flow Monitor SM NFI to Stack Overflow SM FI; RAM SM NFI to Flash SM FI; RAM SM NFI to Stack Underflow SM FI; RAM SM NFI to Stack Overflow SM FI; Flash SM NFI to Stack Underflow SM FI; Flash SM NFI to Stack Overflow SM FI; and Flash SM NFI to Stack Overflow SM FI.

In yet another example, the second controller stores FI (e.g., valid fault codewords) and other NFI (e.g., valid fault codewords) within the second controller characterized by a hamming distance equal to or greater than 4 to each other. The pairs include ALU/Core SM FI to Program Flow Monitor SM NFI; ALU/Core SM FI to RAM SM NFI; ALU/Core SM FI to Flash SM NFI; ALU/Core SM FI to Stack Underflow SM NFI; ALU/Core SM FI to Stack Overflow SM NFI; Program Flow Monitor SM FI to RAM SM NFI; Program Flow Monitor SM FI to Flash SM NFI; Program Flow Monitor SM FI to Stack Underflow SM NFI; Program Flow Monitor SM FI to Stack Overflow SM NFI; RAM SM FI to Flash SM NFI; RAM SM FI to Stack Underflow SM NFI; RAM SM FI to Stack Overflow SM NFI; Flash SM FI to Stack Underflow SM NFI; Flash SM FI to Stack Overflow SM NFI; and Flash SM FI to Stack Overflow SM NFI.

In yet another example, the second controller stores the binary value pairs below have equal to or greater than 8 to each other. The pairs include Controller 1 (e.g., the first controller) ALU/Core SM NFI to Controller 2 (e.g., the second controller) ALU/Core SM NFI; Controller 1 ALU/Core SM FI to Controller 2 ALU/Core SM FI; Controller 1 ALU/Core SM NFI to Controller 2 ALU/Core SM NFI; Controller 1 ALU/Core SM FI to Controller 2 ALU/Core SM NFI; Controller 1 Program Flow Monitor [PFM] SM NFI to Controller 2 PFM SM NFI; Controller 1 PFM SM FI to Controller 2 PFM SM FI; Controller 1 PFM SM NFI to Controller 2 PFM SM NFI; Controller 1 PFM SM FI to Controller 2 PFM SM NFI; Controller 1 RAM SM NFI to Controller 2 RAM SM NFI; Controller 1 RAM SM FI to Controller 2 RAM SM FI; Controller 1 RAM SM NFI to Controller 2 RAM SM NFI; Controller 1 RAM SM FI to Controller 2 RAM SM NFI; Controller 1 Flash SM NFI to Controller 2 Flash SM NFI; Controller 1 Flash SM FI to Controller 2 Flash SM FI; Controller 1 Flash SM NFI to Controller 2 Flash SM NFI; Controller 1 Flash SM FI to Controller 2 Flash SM NFI; Controller 1 Stack Underflow SM NFI to Controller 2 Stack Underflow SM NFI; Controller 1 Stack Underflow SM FI to Controller 2 Stack Underflow SM FI; Controller 1 Stack Underflow SM NFI to Controller 2 Stack Underflow SM NFI; Controller 1 Stack Underflow SM FI to Controller 2 Stack Underflow SM NFI; Controller 1 Stack Underflow SM NFI to Controller 2 Stack Underflow SM NFI; Controller 1 Stack Underflow SM FI to Controller 2 Stack Underflow SM FI; Controller 1 Stack Underflow SM NFI to Controller 2 Stack Underflow SM NFI; and Controller 1 Stack Underflow SM FI to Controller 2 Stack Underflow SM NFI.

Therefore, the first controller and the second controller implementing valid functional codewords and valid fault codewords exhibit freedom from interference (FFI) from each other.

7.3 Storing Valid Codewords: Overall Controller State

In one implementation, in Block S110, the first controller stores: a valid functional codeword representing a functional state of the first controller; and a valid fault codeword representing a fault state of the first controller and characterized by a minimum hamming distance from the valid functional codeword representing a functional state of the first controller. For example, the first controller can store the valid functional codeword and the valid fault codeword characterized by a minimum hamming distance of 4 from each other.

Similarly, in one implementation, in Block S110, the second controller stores: a valid functional codeword representing a functional state of the second controller; and a valid fault codeword representing a fault state of the second controller and characterized by a minimum hamming distance from the valid functional codeword representing a functional state of the second controller. For example, the second controller can store the valid functional codeword and the valid fault codeword characterized by a minimum hamming distance of 4 from each other.

In one implementation, the valid codewords representing state of a controller each exhibit a length of 8 bits (e.g., one byte).

In one example, the first controller can store: a valid functional codeword representing a functional state of the first controller as "11110010;" and a valid fault codeword representing a fault state of the first controller as "10100100."

In another example, the second controller can store: a valid functional codeword representing a functional state of the second controller as "00101111;" and a valid fault codeword representing a fault state of the second controller as "01001010."

In one implementation, the valid functional codeword for the first controller and the valid functional codeword exhibit inverse nibble values to each other (e.g., "1111, 0010" versus "0010, 1111"). Similarly, in one implementation, the valid fault codeword for the first controller and the valid fault codeword exhibit inverse nibble values to each other (e.g., "1010, 0100" versus "0100, 1010").

In one implementation, in Block S110, the first controller stores: a valid functional codeword representing a functional state of the second controller; and a valid fault codeword representing a fault state of the second controller and characterized by a minimum hamming distance (e.g., 4) from the valid functional codeword representing a functional state of the second controller.

In one implementation, in Block S110, the second controller stores: a valid functional codeword representing a functional state of the first controller; and a valid fault codeword representing a fault state of the first controller and characterized by a minimum hamming distance (e.g., 4) from the valid functional codeword representing a functional state of the first controller.

7.4 Storing Valid Codewords: External Input

In one implementation, in Block S110, the first controller stores: a valid functional codeword representing a functional state of a first input coupled to the system; and a valid fault codeword representing a fault state of the first input and characterized by a minimum hamming distance (e.g., 4) from the valid functional codeword representing a functional state of the first input.

In one implementation, in Block S110, the second controller stores: a valid functional codeword representing a functional state of a second input coupled to the system; and a valid fault codeword representing a fault state of the second input and characterized by a minimum hamming distance (e.g., 4) from the valid functional codeword representing a functional state of the second input.

In one variation, the first controller and the second controller can each store respective valid functional/fault codewords for more than one input. In one example, each valid functional/fault codeword pair can exhibit a minimum hamming distance (e.g., 4) from each other. In another example, each valid codeword can exhibit a minimum hamming distance (e.g., 4) from other valid codewords.

In one implementation, the valid codewords representing state of an input each exhibit a length of 8 bits (e.g., one byte).

7.5 Storing Valid Codewords: Safety Module Timeout

In one implementation, in Block S110, the first controller stores: a valid functional codeword representing a functional timeout state of the second controller; and a valid fault codeword representing a fault timeout state of the second controller and characterized by a minimum hamming distance (e.g., 8) from the valid functional codeword representing a functional timeout state of the second controller.

In one implementation, the first controller stores these valid codewords as a different bit pattern exhibiting a length of 16 bits (e.g., one word, two bytes, four nibbles). Each 16-bit word includes an upper byte and a lower byte. Each byte includes an upper nibble and a lower nibble.

For example, the first controller can store: a valid functional codeword representing a functional timeout state of the second controller as "12, 5, 11, 7" (expressed in binary as "1100010110110111"); and a valid fault codeword representing a fault timeout state of the second controller as "7, 11, 5, 12" (expressed in binary as "0111101101011100").

Similarly, in one implementation, the second controller stores: a valid functional codeword representing a functional timeout state of the first controller; and a valid fault codeword representing a fault timeout state of the first controller and characterized by a minimum hamming distance (e.g., 8) from the valid functional codeword representing a functional timeout state of the first controller.

For example, the second controller can store: a valid functional codeword representing a functional timeout state of the first controller as "5, 12, 7, 11" (expressed in binary as "0101110001111011"); and a valid fault codeword representing a fault timeout state of the first controller as "11, 7, 12, 5" (expressed in binary as "1011011111000101").

In one variation: the upper byte of a valid fault codeword exhibits only odd values, and the lower byte of the valid fault codeword exhibits only even values; the upper byte of a valid functional codeword exhibits only even values, and the lower byte of the valid functional codeword exhibits only odd values. In another variation: the upper byte of a valid fault codeword exhibits only even values, and the lower byte of the valid fault codeword exhibits only odd values; the upper byte of a valid functional codeword exhibits only odd values, and the lower byte of the valid functional codeword exhibits only even values. "Odd" and "even" here describe the number of bits instead of an odd or even value of the decimal number.

In one implementation, in Block S110, the first controller stores: a valid functional codeword representing a functional state of communicated content from the second controller; and a valid fault codeword representing a fault state of communicated content from the second controller and characterized by a minimum hamming distance (e.g., 8) from the valid functional codeword representing a functional state of communicated content from the second controller.

Similarly, in one implementation, in Block S110, the second controller stores: a valid functional codeword representing a functional state of communicated content from the first controller; and a valid fault codeword representing a fault state of communicated content from the first controller and characterized by a minimum hamming distance (e.g., 8) from the valid functional codeword representing a functional state of communicated content from the first controller.

In one implementation, in Block S110, the first controller stores: a valid functional codeword representing a functional state of communicated content from the application processor; and a valid fault codeword representing a fault state of communicated content from the application processor and characterized by a minimum hamming distance (e.g., 8) from the valid functional codeword representing a functional state of communicated content from the application processor.

Similarly, in one implementation, in Block S110, the second controller stores: a valid functional codeword representing a functional state of communicated content from the application processor; and a valid fault codeword representing a fault state of communicated content from the application processor and characterized by a minimum hamming distance (e.g., 8) from the valid functional codeword representing a functional state of communicated content from the application processor.

In one implementation, the first controller stores these valid codewords, each characterized by a minimum hamming distance (e.g., 4) from other valid codewords.

For example, the first controller (shown as "MA") and the second controller (shown as "MB") can each store codewords as shown in FIGS. 5A, 5B, 5C, 5D, and 6 (application processor shown as "AP").

In this example, all four communication SM value NFI (e.g., valid functional codewords)/FI (e.g., valid fault codewords) pairs within the first controller MA are characterized by a hamming distance greater than or equal to 8 from each other. All four NFI within the first controller MA are characterized by a hamming distance greater than or equal to 4 from each other. All four FI within the first controller MA are characterized by a hamming distance greater than or equal to 4 from each other. Any of the four NFI within first controller MA are characterized by a hamming distance greater than or equal to 4 from any of the 4 FI within the first controller MA.

Similarly, all four communication SM value NFI (e.g., valid functional codewords)/FI (e.g., valid fault codewords) pairs within the second controller MB are characterized by a hamming distance greater than or equal to 8 from each other. All four NFI within the second controller MB are characterized by a hamming distance greater than or equal to 4 from each other. All four FI within the second controller MB are characterized by a hamming distance greater than or equal to 4 from each other. Any of the four NFI within second controller MB are characterized by a hamming distance greater than or equal to 4 from any of the 4 FI within the second controller MB.

7.6 Storing Valid Codewords: Safety Controller Timeout

In one implementation, in Block S110, the first controller stores: a valid functional codeword representing a functional timeout state of a third controller within a second safety module coupled to the system; a valid fault codeword representing a fault timeout state of the third controller and characterized by a minimum hamming distance (e.g., 8) from the valid functional codeword representing a functional timeout state of the third controller; a valid functional codeword representing a functional timeout state of a fourth controller within a third safety module coupled to the system; a valid fault codeword representing a fault timeout state of the fourth controller and characterized by a minimum hamming distance (e.g., 8) from the valid functional codeword representing a functional timeout state of the fourth controller; a ninth valid functional codeword representing a functional timeout state of a set of monitored controllers including the third controller and the fourth controller; and a ninth valid fault codeword representing a fault timeout state of the set of monitored controllers and characterized by a minimum hamming distance (e.g., 8) from the ninth valid functional codeword representing a functional timeout state of the set of monitored controllers.

In one variation, the first controller can store a greater or fewer number of valid functional codewords corresponding to a greater or fewer number of controllers of other safety modules being monitored by the first controller and included in the set of monitored controllers.

In one implementation, the first controller stores these valid codewords as a different bit pattern exhibiting a length of 16 bits (e.g., one word, two bytes, four nibbles). Each 16-bit word includes an upper byte and a lower byte. Each byte includes an upper nibble and a lower nibble. In one variation, the first controller stores the valid functional codeword representing a functional timeout state of the set of monitored controllers and the valid fault codeword representing a fault timeout state of the set of monitored controllers as different bit patterns each exhibiting a length of 8 bits (e.g., one byte).

In one implementation: the upper byte of a valid fault codeword exhibits only odd values, and the lower byte of the valid fault codeword exhibits only even values; the upper byte of a valid functional codeword exhibits only even values, and the lower byte of the valid functional codeword exhibits only odd values. In one variation: the upper byte of a valid fault codeword exhibits only even values, and the lower byte of the valid fault codeword exhibits only odd values; the upper byte of a valid functional codeword exhibits only odd values, and the lower byte of the valid functional codeword exhibits only even values.

In one implementation, the first controller stores valid functional/fault codewords representing a timeout state for a given controller characterized by a minimum hamming distance (e.g., 8) from each other. In one implementation, the first controller stores these valid codewords each characterized by a minimum hamming distance (e.g., 4) from other valid codewords.

In one variation, in Block S110, the second controller can store valid codewords representing timeout states of controllers within other safety modules in an analogous manner as described above in connection with the first controller, such as described in the foregoing example.

7.6.1 Storing Valid Codewords: Safety Controller Timeout Example

In one example, the first controller (shown as "MA") and the second controller (shown as "MB") within the safety module can each store codewords as shown in FIGS. 5A, 5B, 5C, 5D, and 6.

In this example, the first controller (MA) and the second controller (MB) in the safety module monitor timeout state for respective MA controllers and MB controllers in devices D1-D12. In particular, the safety module is a safety controller for devices D1-D12, and devices D1-D12 are each safety modules.

In one implementation, the first controller monitors timeout state for MA controller in device D1, MA controller in device D2, MA controller in device D3, etc. Similarly, the second controller monitors timeout state for MB controller in device D1, MB controller in device D2, MB controller in device D3, etc.

In one implementation, the first controller stores valid functional/fault codewords, each representing a respective state of MA controllers in devices D1-D12. Similarly, the second controller stores valid functional/fault codewords each representing a respective state of MB controllers in devices D1-D12.

In one implementation, the first controller and the second controller store these valid codewords as a different bit pattern exhibiting a length of 16 bits (e.g., one word, two bytes, four nibbles). Each 16-bit word includes an upper byte and a lower byte. Each byte includes an upper nibble and a lower nibble. In one implementation, each byte (e.g., an upper byte, a lower byte) of each valid codeword includes an odd value nibble and an even value nibble.

For example, the first controller can store: a valid fault codeword representing a fault timeout state of the third controller (e.g., MA of device D1) as "14, 3, 7, 5" (expressed in binary as "1110001101110101"); and a valid functional codeword representing a functional timeout state of the third controller as "7, 5, 14, 3" (expressed in binary as "0111010111100011").

In one variation: the upper byte of the valid functional codeword and the lower byte of the valid fault codeword are equivalent to each other; and the upper byte of the valid fault codeword and the lower byte of the valid functional codeword are equivalent to each other. For example, the upper byte of the valid functional codeword representing a functional timeout state of the controller MA of device D1 (e.g., "7, 5") and the lower byte of the valid fault codeword representing a fault timeout state of the controller MA of device D1 (e.g., "7, 5") are equivalent to each other. Furthermore, the upper byte of the valid fault codeword (e.g., "14, 3") and the lower byte of the valid functional codeword are equivalent to each other (e.g., "14, 3").

7.7 Storing Valid Codewords: System State

In one implementation, in Block S110, the first controller stores: a valid functional codeword representing a functional state of the system; and a valid fault codeword representing a fault state of the system and characterized by a minimum hamming distance (e.g., 4) from the valid functional codeword representing a functional state of the system.

In one implementation, in Block S110, the second controller stores: a valid functional codeword representing a functional state of the system; and a valid fault codeword representing a fault state of the system and characterized by a minimum hamming distance (e.g., 4) from the valid functional codeword representing a functional state of the system.

In one example, each valid functional/fault codeword pair can exhibit a minimum hamming distance (e.g., 4) from each other. In another example, each valid codeword can exhibit a minimum hamming distance (e.g., 4) from other valid codewords.

In one implementation, the valid codewords representing state of the system each exhibit a length of 8 bits (e.g., one byte).

8. First Controller: Subsystem Monitoring

Block S120 of the method S100 recites: during a first time period: in response to detecting functional operation of the first subsystem, storing the first valid functional codeword in a first memory.

Generally, in Block S120, during a monitoring period, the first controller: individually monitors each subsystem in a set of subsystems within the first controller; detects operation (e.g., functional operation, fault operation) for each subsystem based on the monitoring; detects a respective state of each subsystem corresponding to the detected operation of the subsystem; encodes the detected states into codewords corresponding to the detected states; and stores valid codewords (e.g., valid functional codeword, valid fault codeword) in memory based on the detected states.

In one implementation, the first controller individually monitors each subsystem in a set of subsystems within the first controller. In one example, the first controller can individually monitor: the ALU, the RAM, the flash memory, the program flow monitor safety mechanism, the stack overflow safety mechanism, and/or the stack underflow safety mechanism. In another example, the first controller individually performs a diagnostic test on each subsystem.

In one implementation, the first controller detects operation (e.g., functional operation, fault operation) for each subsystem based on the monitoring. In one example, the first controller can detect functional operation of the ALU based on performance a diagnostic test resulting without error. In another example, the first controller can detect fault operation of the stack overflow safety mechanism based on an instance of stack overflow being detected.

In one implementation, the first controller detects functional operation of a subsystem in an absence of errors being detected for a given subsystem, and the first controller detects fault operation when one or more errors are detected for the given subsystem. For example, an error may be defined based on nature of the given subsystem, a safety standard associated with the given subsystem, and/or any factor applicable to the given subsystem.

Generally, the first controller detects a respective state of each subsystem corresponding to the detected operation of the subsystem. In one implementation, the first controller: detects a functional state of a subsystem in response to detecting functional operation of the subsystem; and detects a fault state of a subsystem in response to detecting fault operation of the subsystem. In one example, the first controller detects a functional state of the ALU in response to detecting functional operation of the ALU. In another example, the first controller detects a fault state of the stack overflow safety mechanism in response to detecting fault operation of the stack overflow safety mechanism.

Generally, the first controller encodes the detected states into codewords corresponding to the detected states of the subsystems. In one implementation, the first controller selects a valid codeword from the first set of valid codewords that corresponds to the detected state. In one example, the first controller selects a valid functional codeword representing functional operation of the ALU in response to detecting a functional state of the ALU. In another example, the first controller selects a valid fault codeword representing fault operation of the stack overflow safety mechanism in response to detecting a fault state of the stack overflow safety mechanism.

Generally, the first controller stores respective valid codewords (e.g., valid functional codeword, valid fault codeword) for each subsystem in the set of subsystems in memory. In one implementation, the first controller stores a valid functional codeword representing functional operation of a subsystem in memory. In one variation, the first controller stores a valid fault codeword representing fault operation of the subsystem in memory. In one example, the first controller stores a valid functional codeword representing functional operation of the ALU in a first memory. In another example, the first controller stores a valid fault codeword representing fault operation of the stack overflow safety mechanism in a second memory.

In one implementation, the first controller stores the valid codewords in the flash memory within the first controller. In one variation, the first controller stores the valid codewords in an external memory.

9. First Controller: Overall Controller State

Block S130 of the method S100 recites: during a second time period after the first time period, at the first controller, in response to detecting a match between contents of the first memory and the first valid functional codeword, and in response to detecting functional operation of the first input, outputting a first safety message including the second valid functional codeword and the fourth valid functional codeword; and during a fourth time period after the third time period, at the first controller, in response to detecting a mismatch between contents of the first memory and every codeword in the first set of valid codewords, outputting a second safety message including the second valid fault codeword and the fourth valid fault codeword.

Generally, in Block S130, during an evaluation period after the monitoring period, the first controller: detects whether codewords stored in memory during the monitoring period match valid codewords; detect an overall state of the first controller based on: (i) whether codewords stored in memory during the monitoring period match valid codewords, and (ii) the detected states; and output a safety message.

In one implementation, the first controller detects a match between contents of a memory and a valid codeword included in the set of valid codewords. In one variation, the first controller detects a mismatch between contents of a memory and every valid codeword in the set of valid codewords.

For example, if the contents of a memory associated with the ALU is "8, 1, 2, 8" the first controller detects a mismatch between the contents of the memory and every valid codeword in the set of valid codewords because the valid functional codeword for the ALU is "13, 14, 14, 13" and the valid fault codeword for the ALU is "8, 2, 2, 8," and because no valid codeword in the set of valid codewords is "8, 1, 2, 8."

In one implementation, the first controller indicates a given subsystem is in a fault state in response to detecting a mismatch between contents of a memory associated with the given subsystem and every valid codeword in the set of valid codewords. For example, the first controller can store a valid fault codeword representing a fault state of the given subsystem in a memory in response to detecting the mismatch.

In one implementation, the first controller detects an overall state of the first controller based on the codewords representing the detected states of the set of subsystems. In one implementation, the first controller detects an overall state of the first controller based on a set of rules. In one example, the first controller can detect a functional state of the first controller in response to detecting every subsystem in the set of subsystems is in a functional state and/or detecting a valid functional codeword in memory for every subsystem in the set of subsystems. In another example, the first controller can detect a fault state of the first controller in response to detecting one subsystem in the set of subsystems is in a fault state and/or detecting a valid fault codeword in memory for one subsystem in the set of subsystems.

In one implementation, the first controller indicates a valid functional codeword representing a functional state of the first controller in response to detecting a functional state of the first controller. In one variation, the first controller indicates a valid fault codeword representing a fault state of the first controller in response to detecting a fault state of the first controller. In one example, the first controller can store a valid functional codeword (e.g., "11110010") representing a functional state of the first controller in memory. In another example, the first controller can store a valid fault codeword (e.g., "10100100") representing a fault state of the first controller in memory.

Generally, the first controller outputs a safety message including a valid codeword representing a state of the first controller. In one implementation, the first controller outputs a safety message including a valid functional codeword representing a functional state of the first controller in response to: detecting a match between contents of the memory and the set of valid codewords, detecting functional operation of the set of subsystems. In one variation, the first controller outputs a safety message including a valid fault codeword representing a fault state of the first controller in response to: detecting a mismatch between contents of the memory and every valid codeword in the set of valid codewords. In another variation, the first controller outputs a safety message including a valid fault codeword representing a fault state of the first controller in response to: detecting a match between contents of the memory and the set of valid codewords, detecting fault operation of at least one subsystem in the set of subsystems.

In one implementation, the first controller outputs a safety message including a valid functional codeword representing a functional state of the first controller in a third byte (e.g., "M0") of the safety message. In one variation, the first controller outputs a safety message including a valid fault codeword representing a fault state of the first controller in a third byte (e.g., "M0") of the safety message.

The first controller then outputs the safety message to the second controller and/or to the application processor.

10. External Input

Block S122 of the method S100 recites: during a first time period: in response to detecting functional operation of the first input, storing the third valid functional codeword in a second memory.

Generally, in Block S122, during a monitoring period, the first controller: monitors an input coupled to the system (e.g., emergency stop button, line break sensor); detects operation (e.g., functional operation, fault operation) of the input based on the monitoring; detects a respective state of the input corresponding to the detected operation of the subsystem; encodes the detected state into a codeword corresponding to the detected state; and stores a valid codeword (e.g., valid functional codeword, valid fault codeword) in memory based on the detected state.

In one implementation, the first controller: reads and converts an analog voltage at an analog input pin into a set of input counts; reads a digital power supply signal from the ADC as a set of reference counts; corrects (e.g., scales) the input counts based on the set of reference counts to calculate a corrected input count; and encodes the corrected input count into a first encoded logic output value (e.g., valid codeword), such as described in U.S. patent application Ser. No. 17/332,635, filed on 27 May 2021, which is incorporated in its entirety by this reference.

In one implementation, the first controller stores a valid functional codeword representing functional operation of the input in memory. In one variation, the first controller stores a valid fault codeword representing fault operation of the input in memory.

In one implementation, the first controller stores the valid codewords in the flash memory within the first controller. In one variation, the first controller stores the valid codewords in an external memory.

In one variation, the first controller performs Block S122 for each additional input monitored by the first controller.

In one variation, in Block S130, during an evaluation period after a monitoring period, the first controller outputs a safety message including a valid codeword representing a state of the input in response to detecting operation (e.g., functional operation, fault operation) of the input. For example, the first controller outputs a safety message including a valid functional codeword representing functional operation of the input in response to detecting functional operation of the input. In another example, the first controller outputs a safety message including a valid fault codeword representing fault operation of the input in response to detecting fault operation of the input. In yet another example, the first controller outputs a safety message including a valid functional codeword representing functional operation of the input in a fourth byte (e.g., "I1") of the safety message. In yet another example, the first controller outputs a safety message including a valid fault codeword representing fault operation of the input in a fourth byte (e.g., "I1") of the safety message.

11. Inter-Controller Communication

Blocks S124, S140, S142 of the method S100 recite: during the first time period, at the first controller: querying an input register coupled to the second controller; detecting, in the input register, a fourth safety message including the sixth valid functional codeword from the second controller; during a third time period, querying an input register coupled to the first controller; and, in response to detecting non-receipt of a third safety message from the input register within a first time quantum, storing the ninth valid fault codeword in a fifth memory.

Generally, in Blocks S124, S140, S142, during a monitoring period, the first controller: queries an input register coupled to the second controller; detects whether a safety message is in the input register within a predefined time quantum; detects a timeout state of the second controller; encodes the detected state into a codeword corresponding to the detected state; and stores a valid codeword (e.g., valid functional codeword, valid fault codeword) in memory based on the detected state.

In one implementation, during a monitoring period, the first controller queries an input register coupled to the second controller. For example, the first controller can query an input of the first controller configured to receive safety messages from the second controller.

In one implementation, the first controller detects receipt of a safety message in the input register from the second controller within a predefined time quantum. For example, the first controller can: monitor an elapsed time since a most recent safety message was received from the second controller; and detect receipt of the safety message within the predefined time quantum in response to detecting the elapsed time is within a threshold amount of time.

In one implementation, the predefined time quantum and/or threshold amount of time can be selected based on safety standard, timing requirement, communication protocol, and/or any other factor.

In one variation, the first controller detects non-receipt of a safety message in the input register from the second controller within a predefined time quantum. For example, the first controller can: monitor an elapsed time since a most recent safety message was received from the second controller; and detect non-receipt of the safety message within the predefined time quantum in response to detecting the elapsed time exceeds a threshold amount of time.

In one implementation, the first controller detects a functional timeout state of the second controller in response to detecting receipt of a safety message in the input register coupled to the second controller within the predefined time quantum. In one variation, the first controller detects a fault timeout state of the second controller in response to detecting non-receipt of a safety message in the input register coupled to the second controller within the predefined time quantum.

Generally, the first controller encodes the detected timeout state into a codeword corresponding to the detected timeout state. In one implementation, the first controller selects a valid codeword from the first set of valid codewords that corresponds to the detected state.

Generally, the first controller stores a valid codeword (e.g., valid functional codeword, valid fault codeword) in memory. In one implementation, the first controller stores a valid functional codeword representing a functional timeout state of the second controller in memory. In one variation, the first controller stores a valid fault codeword representing a fault timeout state of the second controller in memory.

In one variation, in response to detecting receipt of a safety message in the input register from the second controller within a predefined time quantum, the first controller detects whether content of the received safety message is valid. In one example, the first controller checks the content and format of the safety message to determine whether the safety message is erroneous. In another example, the first controller detects whether the safety message conforms with the data structure specified in FIG. 3. In yet another example, the first controller detects a mismatch between a codeword included in the safety message and every valid codeword in the stored set of valid codewords.

In one implementation, the first controller detects a functional state of communicated content from the second controller in response to detecting an absence of errors in content and/or format of the safety message. In one variation, the first controller detects a fault state of communicated content from the second controller in response to detecting one or more errors in content and/or format of the safety message (e.g., a mismatch between a codeword included in the safety message and every valid codeword in the stored set of valid codewords).

In one implementation, the first controller stores valid codewords (e.g., valid functional codeword, valid fault codeword) in memory representing timeout and/or content states of the second controller in memory. For example, the first controller stores a valid functional codeword representing a functional timeout state of the second controller in memory in response to detecting receipt of a safety message in the input register coupled to the second controller within the predefined time quantum. In another example, the first controller stores a valid fault codeword representing a fault timeout state of the second controller in memory in response to detecting non-receipt of a safety message in the input register coupled to the second controller within the predefined time quantum. In yet another example, the first controller stores a valid functional codeword representing a functional communicated content state of the second controller in memory in response to detecting an absence of errors in content and/or format of the safety message. In yet another example, the first controller stores a valid fault codeword representing a fault communicated content state of the second controller in memory in response to detecting one or more errors in content and/or format of the safety message. In yet another example, the first controller forgoes a content check and stores a valid fault codeword representing a fault communicated content state of the second controller in memory in response to detecting non-receipt of a safety message in the input register from the second controller within the predefined time quantum.

In one implementation, the first controller stores the valid codewords in the flash memory within the first controller. In one variation, the first controller stores the valid codewords in an external memory.

Block S130 of the method S100 recites: during a second time period after the first time period, at the first controller, in response to detecting a match between contents of the first memory and the first valid functional codeword, in response to detecting a match between contents of the third memory and the fifth valid functional codeword, and in response to detecting functional operation of the first input, outputting a second safety message including the second valid functional codeword and the sixth valid functional codeword; during a fourth time period after the third time period, at the first controller, in response to detecting a match between contents of the first memory and the first valid functional codeword, and in response to detecting a match between contents of the third memory and the fifth valid fault codeword, outputting a fourth safety message including the second valid functional codeword and the sixth valid fault codeword.

Generally, in Block S130, during an evaluation period after the monitoring period, the first controller: detects whether codewords stored in memory during the monitoring period match valid codewords; detect an overall state of the first controller based on: (i) whether codewords stored in memory during the monitoring period match valid codewords, and (ii) the detected states; and output a safety message.

In one implementation, the first controller detects a match between contents (e.g., codeword representing a functional timeout state of the second controller) of a memory and a valid codeword included in the set of valid codewords (e.g., valid codeword representing a functional timeout state of the second controller, valid codeword representing a functional communicated content state of the second controller). In one variation, the first controller detects a mismatch between contents (e.g., overwritten codeword representing a functional timeout state of the second controller, overwritten codeword representing a functional communicated content state of the second controller) of a memory and every valid codeword in the set of valid codewords.

In one implementation, the first controller indicates the second controller is in a fault timeout state in response to detecting a mismatch between contents (e.g., overwritten codeword representing a functional timeout state of the second controller, overwritten codeword representing a functional communicated content state of the second controller) of a memory and every valid codeword in the set of valid codewords. For example, the first controller can store a valid fault codeword representing a fault timeout state of the second controller in a memory in response to detecting the mismatch.

In one variation, in Block S130, during an evaluation period after a monitoring period, the first controller outputs a safety message including a valid codeword representing a state of the second controller in response to detecting receipt/non-receipt of a safety message from the second controller within a predefined time quantum. For example, the first controller outputs a safety message including a valid functional codeword representing functional operation of the second controller in response to detecting receipt of a safety message (including the valid functional codeword representing functional operation of the second controller) from the second controller within a predefined time quantum. In another example, the first controller outputs a safety message including a valid functional codeword representing functional operation of the second controller in response to detecting an absence of errors in content and/or format of the safety message from the second controller. In yet another example, the first controller outputs a safety message including a valid fault codeword representing fault operation of the second controller in response to detecting one or more errors in content and/or format of the safety message. In yet another example, the first controller outputs a safety message including a valid fault codeword representing fault operation of the second controller in response to detecting non-receipt of a safety message from the second controller within a predefined time quantum. In yet another example, the first controller outputs a safety message including a valid fault codeword representing fault operation of the second controller in response to detecting a mismatch between contents (e.g., overwritten codeword representing a functional timeout state of the second controller) of a memory associated with the second controller and every valid codeword in the set of valid codewords.

In one variation, the first controller can detect communication faults with the application processor in an analogous manner. In particular, the first controller and application processor can monitor timeout and detect communicated content faults with each other in an analogous manner as described above in connection with the first controller and the second controller.

Generally, the first controller can detect a state of the second controller based on contents of safety messages received from the second controller. For example, the safety message from the second controller can include a state (e.g., valid functional codeword, valid fault codeword) of the second controller, such as in the third byte (e.g., "M1") of the safety message. Therefore, the first controller can detect infrastructure issues with the second controller.

Similarly, the first controller can detect a state of the input based on contents of safety messages received from the second controller. For example, the safety message from the second controller can include a state (e.g., valid functional codeword, valid fault codeword) of the input as processed by the second controller, such as in the fourth byte (e.g., "I1") of the safety message.

In one implementation, in response to detecting a match between a state of the input as detected by the first controller and a state of the input as indicated in the safety message from the second controller, the first controller can detect the state is true. In one variation, in response to detecting a mismatch between a state of the input as detected by the first controller and a state of the input as indicated in the safety message from the second controller, the first controller can detect a fault state of the input. Therefore, probability of an error in a message is reduced below a threshold maximum error value as required by functional safety standards (e.g., IEC 61784), which is beneficial when communicating in media prone to interference (e.g., wireless communications, high utilization wired communications).

12. Safety Controller

Block S126 of the method S100 recites, during the first time period: in response to detecting receipt of a fifth safety message from a third controller (e.g., within a second safety module) within a third time quantum, storing the seventh valid functional codeword in a fourth memory; in response to detecting non-receipt of a sixth safety message from the fourth controller (e.g., within a third safety module) within a fourth time quantum, storing the eighth valid fault codeword in a fifth memory; and wherein outputting, at the first controller during the second period of time, the second safety message includes outputting the second safety message including the second valid functional codeword, the sixth valid functional codeword, and the ninth valid fault codeword in response to detecting a match between contents of the first memory and the first valid functional codeword, in response to detecting a match between contents of the third memory and the fifth valid functional codeword, in response to detecting functional operation of the first input, in response to detecting a match between contents of the fourth memory and the seventh valid functional codeword, and in response to detecting a match between the fifth memory and the eighth valid fault codeword.

Generally, in Block S126, during a monitoring period, the first controller: detects receipt (or non-receipt) of safety messages from each controller in a set of monitored controllers within other safety modules within predefined time quanta; detects a respective timeout state for each controller in the set of monitored controllers; encodes the detected states into a codewords corresponding to the detected state; and stores valid codeword (e.g., valid functional codeword, valid fault codeword) in memory based on the detected states.

In one implementation, during a monitoring period, the first controller detects receipt (or non-receipt) of safety messages from each controller in a set of monitored controllers within other safety modules within predefined time quanta. In one example, the first controller can receive the safety messages from the application processor.

In one implementation, the first controller independently detects receipt of safety messages from each controller in a set of monitored controllers within other safety modules within predefined time quanta. In one example, the first controller can: independently monitor an elapsed time since a most recent safety message was received from a given controller in the set of monitored controllers; and detect receipt of the safety message within the predefined time quantum in response to detecting the elapsed time is within a threshold amount of time.

In one variation, the first controller can: independently monitor an elapsed time since a most recent safety message was received from a given controller in the set of monitored controllers; and detect non-receipt of the safety message within the predefined time quantum in response to detecting the elapsed time exceeds the threshold amount of time.

In some implementations, the first controller receives safety messages from the set of monitored controllers at different times.

In one implementation, the predefined time quantum and/or threshold amount of time can be selected based on safety standard, timing requirement, communication protocol, and/or any other factor. In one variation, the predefined time quantum and/or threshold amount of time can be selected individually for each controller in the set of monitored controllers.

In one implementation, the first controller detects a functional timeout state of a given controller in the set of monitored controllers in response to detecting receipt of a safety message within the predefined time quantum. In one variation, the first controller detects a fault timeout state of the given controller in response to detecting non-receipt of a safety message within the predefined time quantum.

Generally, the first controller encodes the detected timeout state into a codeword corresponding to the detected timeout state. In one implementation, the selects a valid codeword from the first set of valid codewords that corresponds to the detected state.

Generally, the first controller stores a valid codeword (e.g., valid functional codeword, valid fault codeword) in memory. In one implementation, the first controller stores a valid functional codeword representing a functional timeout state of a given controller in the set of monitored controllers in memory. In one variation, the first controller stores a valid fault codeword representing a fault timeout state of the given controller in memory.

In one variation, in response to detecting receipt of a safety message from a given controller in the set of monitored controllers within a predefined time quantum, the first controller detects whether content of the received safety message is valid. In one example, the first controller checks the content and format of the safety message to determine whether the safety message is erroneous. In another example, the first controller detects whether the safety message conforms with the data structure specified in FIG. 3. In yet another example, the first controller detects a mismatch between a codeword included in the safety message and every valid codeword in the stored set of valid codewords.

In one implementation, the first controller detects a functional state of communicated content from the given controller in response to detecting an absence of errors in content and/or format of the safety message. In one variation, the first controller detects a fault state of communicated content from the given controller in response to detecting one or more errors in content and/or format of the safety message (e.g., a mismatch between a codeword included in the safety message and every valid codeword in the stored set of valid codewords).

In one implementation, the first controller stores valid codewords (e.g., valid functional codeword, valid fault codeword) in memory representing timeout and/or content states of the given controller in memory. For example, the first controller stores a valid functional codeword representing a functional timeout state of the given controller in memory in response to detecting receipt of a safety message within the predefined time quantum. In another example, the first controller stores a valid fault codeword representing a fault timeout state of the given controller in memory in response to detecting non-receipt of a safety message within the predefined time quantum. In yet another example, the first controller stores a valid functional codeword representing a functional communicated content state of the given controller in memory in response to detecting an absence of errors in content and/or format of the safety message. In yet another example, the first controller stores a valid fault codeword representing a fault communicated content state of the given controller in memory in response to detecting one or more errors in content and/or format of the safety message. In yet another example, the first controller forgoes a content check and stores a valid fault codeword representing a fault communicated content state of the given controller in memory in response to detecting non-receipt of a safety message in the input register from the given controller within the predefined time quantum.

In one implementation, the first controller stores the valid codewords in the flash memory within the first controller. In one variation, the first controller stores the valid codewords in an external memory.

Block S126, S130 of the method S100 recites: during the first time period: in response to detecting receipt of a fifth safety message from a third controller (e.g., within a second safety module) within a third time quantum, storing the seventh valid functional codeword in a fourth memory; in response to detecting non-receipt of a sixth safety message from the fourth controller (e.g., within a third safety module) within a fourth time quantum, storing the eighth valid fault codeword in a fifth memory; and wherein outputting, at the first controller during the second period of time, the second safety message includes outputting the second safety message including the second valid functional codeword, the sixth valid functional codeword, and the ninth valid fault codeword in response to detecting a match between contents of the first memory and the first valid functional codeword, in response to detecting a match between contents of the third memory and the fifth valid functional codeword, in response to detecting functional operation of the first input, in response to detecting a match between contents of the fourth memory and the seventh valid functional codeword, and in response to detecting a match between the fifth memory and the eighth valid fault codeword.

Generally, in Block S130, during an evaluation period after the monitoring period, the first controller: detects whether codewords stored in memory during the monitoring period match valid codewords; detect an overall state of the first controller based on: (i) whether codewords stored in memory during the monitoring period match valid codewords, and (ii) the detected states; and output a safety message.

In one implementation, the first controller detects a match between contents of a memory and a valid codeword included in the set of valid codewords. In one variation, the first controller detects a mismatch between contents of a memory and every valid codeword in the set of valid codewords.

In one implementation, the first controller indicates a given controller in the set of monitored controllers is in a fault timeout state in response to detecting a mismatch between contents of a memory associated with the given controller and every valid codeword in the set of valid codewords. For example, the first controller can store a valid fault codeword representing a fault timeout state of the given controller in a memory in response to detecting the mismatch.

In one implementation, the first controller detects an overall timeout state of the set of monitored controllers based on the codewords representing the detected states of the set of subsystems. In one implementation, the first controller detects an overall timeout state of the set of monitored controllers based on a set of rules. In one example, the first controller can detect a functional timeout state of the set of monitored controllers in response to detecting every controller in the set of monitored controllers in a functional timeout state and/or detecting a valid functional codeword in memory for every controller in the set of monitored controllers. In another example, the first controller can detect a fault state of the set of monitored controllers in response to detecting one controller in the set of monitored controllers in a fault timeout state and/or detecting a valid fault codeword in memory for one controller in the set of monitored controllers. In yet another example, the first controller can detect a fault state of the set of monitored controllers in response to detecting two or more controllers in the set of monitored controllers in a fault timeout state and/or detecting two or more valid fault codewords in memory for two or more controllers in the set of monitored controllers.

In one implementation, the first controller stores a valid functional codeword representing a functional timeout state of the set of monitored controllers in memory in response to detecting a functional timeout state of the set of monitored controllers. In one variation, the first controller stores a valid fault codeword representing a fault timeout state of the set of monitored controllers in memory in response to detecting a fault timeout state of the set of monitored controllers.

In one implementation, the first controller stores the valid codewords in the flash memory within the first controller. In one variation, the first controller stores the valid codewords in an external memory.

In one variation, in Block S130, during an evaluation period after a monitoring period, the first controller outputs a safety message including a valid codeword representing a timeout state of the set of monitored controllers. In one example, the first controller can output a safety message including the valid functional codeword representing a functional timeout state of the set of monitored controllers. In another example, the first controller can output a safety message including the valid fault codeword representing a fault timeout state of the set of monitored controllers.

13. System State

In one variation, in Block S130, the first controller can further detect a state (e.g., functional, fault) of the system based on one or more dependencies. For example, the first controller can detect a state of the system based on: a state of the first controller; a state of the input(s); a timeout state of the second controller; a state of the second controller; timeout states of controllers in a set of monitored controllers within other safety modules; communicated content states of controllers in the set of monitored controllers; and/or a timeout state of the set of monitored controllers.

In one implementation, the controller detects a state of the system based on a set of rules. In one example, the first controller can detect a functional state of the system in response to detecting functional states for every dependency (e.g., a state of the first controller; a state of the input(s); a timeout state of the second controller; a state of the second controller; timeout states of controllers in a set of monitored controllers within other safety modules; communicated content states of controllers in the set of monitored controllers; and/or a timeout state of the set of monitored controllers). In another example, the first controller can detect a fault state of the system in response to detecting a fault state of any dependency. In yet another example, the first controller can detect a functional state of the system in response to detecting a fault timeout state for one controller in the set of monitored controllers, and in response to detecting functional states for every other dependency.

In one implementation, the first controller stores valid codewords (e.g., valid functional codeword, valid fault codeword) in memory representing a state of the system in memory. In one example, the first controller stores a valid functional codeword representing a functional state of the system in memory in response to detecting a functional state of the system. In another example, the first controller stores a valid fault codeword representing a fault state of the system in memory in response to detecting a fault state of the system.

In one implementation, the first controller stores the valid codewords in the flash memory within the first controller. In one variation, the first controller stores the valid codewords in an external memory.

In one variation, in Block S130, during an evaluation period after a monitoring period, the first controller outputs a safety message including a valid codeword representing a detected state of the system as described above. In one example, the first controller can output a safety message including the valid functional codeword representing a functional state of the system. In another example, the first controller can output a safety message including the valid fault codeword representing a fault state of the system.

Therefore, the first controller can resolve a combination of multiple states into a single state indicator, thus streamlining communication and maintaining functional safety standards in large networks.

14. Second Controller

In one implementation, the second controller performs Blocks S110, S120, S122, S124, S126, S130, S140, S142 of the method S100 in an analogous (e.g., similar, identical) manner as described above in connection with the first controller.

15. Application Processor

Block S150 recites receiving the first safety message and the third safety message; in response to detecting the fourth valid functional codeword in the first safety message and the eighth valid functional codeword in the third safety message, outputting a fifth safety message including a ninth valid functional codeword representing a functional state of the system; during a sixth time period after the fourth time period, at the application processor, receiving the second safety message and the fourth safety message; and in response to detecting the fourth valid fault codeword in the second safety message and the eighth valid functional codeword in the fourth safety message, outputting a sixth safety message including a ninth valid fault codeword representing a fault state of the system and characterized by a ninth minimum hamming distance from the ninth valid functional codeword.

Generally, in Block S150, after an evaluation period the application processor: receives safety messages from the first controller and the second controller; concatenates safety messages from the first controller and/or the second controller into a concatenated safety message; and outputs a safety message (e.g., over a network to another safety module).

In one implementation, the application processor: analyzes a first safety message from the first controller and a second safety message from the second controller; and outputs a new safety message based on a result of the analysis.

In one implementation, the application processor outputs a safety message indicating a functional state in response to receiving: a first safety message indicating a functional state from the first controller; and a second safety message indicating a functional state from the second controller. For example, the application processor can output a safety message including valid functional codeword representing a functional state of the system in response to receiving: a first safety message indicating a functional state (e.g., valid functional codeword) from the first controller; and a second safety message indicating a functional state (e.g., valid functional codeword) from the second controller.

In one variation, the application processor can output a safety message indicating a fault state in response to receiving: a first safety message indicating a functional state from the first controller; and a second safety message indicating a fault state from the second controller. For example, the application processor can output a safety message including valid fault codeword representing a fault state of the system in response to receiving: a first safety message indicating a functional state (e.g., valid functional codeword) from the first controller; and a second safety message indicating a fault state (e.g., valid fault codeword) from the second controller.

In another variation, the application processor can output a safety message indicating a fault state in response to detecting non-receipt of a safety message from the first controller and/or the second controller within predefined time quanta. For example, the application processor can output a safety message including valid fault codeword representing a fault state of the system in response to: detecting non-receipt of a first safety message from the first controller within a first time quantum; or detecting non-receipt of a second safety message from the second controller within a second time quantum.

In one implementation, the application processor implements the valid functional codeword representing a functional state of the system and the valid fault codeword representing a fault state of the system characterized by a minimum hamming distance (e.g., 4) from each other.

In one implementation, the application processor: receives safety messages (e.g., over the network from another safety module); separates the information within the received safety messages into: a first safety message for the first controller; and a second safety message for the second controller; outputs the first safety message to the first controller; and outputs the second safety message to the second controller.

The systems and methods described herein can be embodied and/or implemented at least in part as a machine configured to receive a computer-readable medium storing computer-readable instructions. The instructions can be executed by computer-executable components integrated with the application, applet, host, server, network, website, communication service, communication interface, hardware/firmware/software elements of a user computer or mobile device, wristband, smartphone, or any suitable combination thereof. Other systems and methods of the embodiment can be embodied and/or implemented at least in part as a machine configured to receive a computer-readable medium storing computer-readable instructions. The instructions can be executed by computer-executable components integrated by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor but any suitable dedicated hardware device can (alternatively or additionally) execute the instructions.

As a person skilled in the art will recognize from the previous detailed description and from the figures and claims, modifications and changes can be made to the embodiments of the invention without departing from the scope of this invention as defined in the following claims.

I claim:

1. A method comprising:
  at a first controller in a safety module coupled to a system, storing a first set of valid codewords comprising:
    a first valid functional codeword representing a functional state of a first subsystem of a first set of subsystems within the first controller;
    a first valid fault codeword representing a fault state of the first subsystem and characterized by a first minimum hamming distance from the first valid functional codeword;
    a second valid functional codeword representing a functional state of the first controller;
    a second valid fault codeword representing a fault state of the first controller and characterized by a second minimum hamming distance from the second valid functional codeword;
    a third valid functional codeword representing a functional state of a first input coupled to the system;
    a third valid fault codeword representing a fault state of the first input and characterized by a third minimum hamming distance from the third valid functional codeword;
    a fourth valid functional codeword representing a functional state of the system; and
    a fourth valid fault codeword representing a fault state of the system and characterized by a fourth minimum hamming distance from the fourth valid functional codeword;
  during a first time period, at the first controller:
    in response to detecting functional operation of the first subsystem, storing the first valid functional codeword in a first memory; and
    in response to detecting functional operation of the first input, storing the third valid functional codeword in a second memory;
  during a second time period following the first time period, at the first controller, in response to detecting a match between contents of the first memory and the first valid functional codeword, and in response to detecting functional operation of the first input, outputting a first safety message comprising the second valid functional codeword and the fourth valid functional codeword;
  during a third time period following the second time period, at the first controller:
    in response to detecting functional operation of the first subsystem, storing the first valid functional codeword in the first memory; and
    in response to detecting functional operation of the first input, storing the third valid functional codeword in the second memory; and
  during a fourth time period following the third time period, at the first controller, in response to detecting a mismatch between contents of the first memory and every codeword in the first set of valid codewords, outputting a second safety message comprising the second valid fault codeword and the fourth valid fault codeword.

2. The method of claim 1, further comprising:
  at a second controller in the safety module, storing a second set of valid codewords comprising:

41 a fifth valid functional codeword representing a functional state of a second subsystem of a second set of subsystems within the second controller;
a fifth valid fault codeword representing a fault state of the second subsystem and characterized by a fifth minimum hamming distance from the fifth valid functional codeword;
a sixth valid functional codeword representing a functional state of the second controller;
a sixth valid fault codeword representing a fault state of the second controller and characterized by a sixth minimum hamming distance from the sixth valid functional codeword;
a seventh valid functional codeword representing a functional state of a second input coupled to the system;
a seventh valid fault codeword representing a fault state of the second input and characterized by a seventh minimum hamming distance from the seventh valid functional codeword;
an eighth valid functional codeword representing a functional state of the system; and
an eighth valid fault codeword representing a fault state of the system and characterized by an eighth minimum hamming distance from the eighth valid functional codeword;
during the first time period, at the second controller:
in response to detecting functional operation of the second subsystem, storing the fifth valid functional codeword in a third memory; and
in response to detecting functional operation of the second input, storing the seventh valid functional codeword in a fourth memory;
during the second time period, at the second controller, in response to detecting a match between contents of the third memory and the fifth valid functional codeword, and in response to detecting functional operation of the second input, outputting a third safety message comprising the sixth valid functional codeword and the eighth valid functional codeword;
during the third time period, at the second controller:
in response to detecting functional operation of the second subsystem, storing the fifth valid functional codeword in the third memory; and
in response to detecting functional operation of the second input, storing the seventh valid functional codeword in the fourth memory;
during the fourth time period, at the second controller, in response to detecting a match between contents of the third memory and the fifth valid functional codeword, and in response to detecting functional operation of the second input, outputting a fourth safety message comprising the sixth valid functional codeword and the eighth valid functional codeword;
during a fifth time period following the second time period, at an application processor within the safety module:
receiving the first safety message and the third safety message; and
in response to detecting the fourth valid functional codeword in the first safety message and the eighth valid functional codeword in the third safety message, outputting a fifth safety message comprising a ninth valid functional codeword representing a functional state of the system; and
during a sixth time period following the fourth time period, at the application processor:

42 receiving the second safety message and the fourth safety message; and
in response to detecting the fourth valid fault codeword in the second safety message and the eighth valid functional codeword in the fourth safety message, outputting a sixth safety message comprising a ninth valid fault codeword representing a fault state of the system and characterized by a ninth minimum hamming distance from the ninth valid functional codeword.

3. The method of claim 2:
wherein the first valid functional codeword represents a functional state of a first arithmetic logic unit within the first controller;
wherein the first valid fault codeword represents a fault state of the first arithmetic logic unit within the first controller and is characterized by a minimum hamming distance of 8 from the first valid functional codeword;
wherein the fifth valid functional codeword represents a functional state of a second arithmetic logic unit within the second controller and is characterized by a minimum hamming distance of 8 from the first valid functional codeword; and
wherein the fifth valid fault codeword represents a fault state of the second arithmetic logic unit within the second controller and is characterized by a minimum hamming distance of 8 from the first valid fault codeword and a minimum hamming distance of 8 from the fifth valid functional codeword.

4. The method of claim 1, further comprising:
at a second controller in the safety module, storing a second set of valid codewords comprising:
a fifth valid functional codeword representing a functional state of a second subsystem of a second set of subsystems within the second controller;
a fifth valid fault codeword representing a fault state of the second subsystem and characterized by a fifth minimum hamming distance from the fifth valid functional codeword;
a sixth valid functional codeword representing a functional state of the second controller;
a sixth valid fault codeword representing a fault state of the second controller and characterized by a sixth minimum hamming distance from the sixth valid functional codeword;
a seventh valid functional codeword representing a functional state of a second input coupled to the system;
a seventh valid fault codeword representing a fault state of the second input and characterized by a seventh minimum hamming distance from the seventh valid functional codeword;
an eighth valid functional codeword representing a functional state of the system; and
an eighth valid fault codeword representing a fault state of the system and characterized by an eighth minimum hamming distance from the eighth valid functional codeword;
during the first time period, at the second controller:
in response to detecting functional operation of the second subsystem, storing the fifth valid functional codeword in a third memory; and
in response to detecting functional operation of the second input, storing the seventh valid functional codeword in a fourth memory;
during the second time period, at the second controller, in response to detecting a match between contents of the third memory and the fifth valid functional codeword and in response to detecting functional operation of the second input, outputting a third safety message comprising the sixth valid functional codeword and the eighth valid functional codeword; and during the first time period, at the first controller:
  querying an input register coupled to the second controller; and
  detecting, in the input register, a fourth safety message comprising the sixth valid functional codeword from the second controller;

wherein outputting, at the first controller during the second time period, the first safety message comprising the third valid functional codeword is further in response to detecting the fourth safety message in the input register within a first time quantum.

5. The method of claim 4, further comprising, during a fifth time period following the second time period, at an application processor within the safety module:
  receiving the first safety message and the third safety message; and
  in response to detecting the fourth valid functional codeword in the first safety message and the eighth valid functional codeword in the third safety message, outputting a fifth safety message comprising a ninth valid functional codeword representing a functional state of the system.

6. The method of claim 4, further comprising:
at the first controller, storing the first set of valid codewords further comprising:
  a ninth valid functional codeword representing a functional timeout state of the second controller; and
  a ninth valid fault codeword representing a fault timeout state of the second controller and characterized by a ninth minimum hamming distance from the ninth valid functional codeword; and
during the first time period, at the first controller, in response to detecting the fourth safety message in the input register within the first time quantum, storing the ninth valid functional codeword in a fifth memory; and
wherein outputting, at the first controller during the second time period, the first safety message comprising the second valid functional codeword and the fourth valid functional codeword is further in response to detecting a match between contents of the fifth memory and the ninth valid functional codeword.

7. The method of claim 1, further comprising:
at a second controller in the safety module, storing a second set of valid codewords comprising:
  a fifth valid functional codeword representing a functional state of a second subsystem of a second set of subsystems within the second controller;
  a fifth valid fault codeword representing a fault state of the second subsystem and characterized by a fifth minimum hamming distance from the fifth valid functional codeword;
  a sixth valid functional codeword representing a functional state of the second controller;
  a sixth valid fault codeword representing a fault state of the second controller and characterized by a sixth minimum hamming distance from the sixth valid functional codeword;
  a seventh valid functional codeword representing a functional state of a second input coupled to the system;
  a seventh valid fault codeword representing a fault state of the second input and characterized by a seventh minimum hamming distance from the seventh valid functional codeword;
  an eighth valid functional codeword representing a functional state of the system;
  an eighth valid fault codeword representing a fault state of the system and characterized by an eighth minimum hamming distance from the eighth valid functional codeword;
  a ninth valid functional codeword representing a functional timeout state of the first controller; and
  a ninth valid fault codeword representing a fault timeout state of the first controller and characterized by a ninth minimum hamming distance from the ninth valid functional codeword;
during the first time period, at the second controller:
  in response to detecting functional operation of the second subsystem, storing the fifth valid functional codeword in a third memory;
  in response to detecting functional operation of the second input, storing the seventh valid functional codeword in a fourth memory;
  querying an input register coupled to the first controller; and
  in response to detecting non-receipt of a third safety message in the input register within a first time quantum, storing the ninth valid fault codeword in a fifth memory; and
during the second time period, at the second controller, in response to detecting a match between contents of the fifth memory and the ninth valid fault codeword, outputting a fourth safety message comprising the eighth valid fault codeword.

8. The method of claim 1, further comprising:
at the first controller, storing the first set of valid codewords further comprising:
  a fifth valid functional codeword representing a functional state of a second subsystem of the first set of subsystems within the first controller and characterized by a minimum hamming distance of 4 from the first valid functional codeword; and
  a fifth valid fault codeword representing a fault state of the second subsystem and characterized by a minimum hamming distance of 4 from the first valid fault codeword and a minimum hamming distance of 8 from the fifth valid functional codeword;
during the first time period, at the first controller, in response to detecting functional operation of the second subsystem, storing the fifth valid functional codeword in a third memory; and
wherein outputting, at the first processor during the second time period, the first safety message comprising the second valid functional codeword and the fourth valid functional codeword is further in response to detecting contents of the third memory matches the fifth valid functional codeword.

9. The method of claim 1:
wherein the first valid functional codeword and the first valid fault codeword each exhibit a length of two bytes;
wherein the second valid functional codeword, the second valid fault codeword, the third valid functional codeword, the third valid fault codeword, the fourth valid functional codeword, and the fourth valid fault codeword each exhibit a length of one byte;
wherein the first minimum hamming distance is 8;
wherein the second minimum hamming distance is 4;

wherein the third minimum hamming distance is 4; and
wherein the fourth minimum hamming distance is 4.

10. The method of claim 1, wherein storing, at the first controller, the first set of valid codewords comprises:
storing a bit pattern of "1101111011101101" as the first valid functional codeword; and
storing a bit pattern of "1000001000101000" as the first valid fault codeword.

11. A method comprising:
at a first controller in a safety module coupled to a system, storing a first set of valid codewords comprising:
  a first valid functional codeword representing a functional state of a first subsystem of a first set of subsystems within the first controller;
  a first valid fault codeword representing a fault state of the first subsystem and characterized by a first minimum hamming distance from the first valid functional codeword;
  a second valid functional codeword representing a functional state of the first controller;
  a second valid fault codeword representing a fault state of the first controller and characterized by a second minimum hamming distance from the second valid functional codeword;
  a third valid functional codeword representing a functional state of a first input coupled to the system;
  a third valid fault codeword representing a fault state of the first input and characterized by a third minimum hamming distance from the third valid functional codeword;
  a fourth valid functional codeword representing a functional state of a second controller within the safety module;
  a fourth valid fault codeword representing a fault state of the second controller and characterized by a sixth minimum hamming distance from the fourth valid functional codeword;
  a fifth valid functional codeword representing a functional timeout state of the second controller;
  a fifth valid fault codeword representing a fault timeout state of the second controller and characterized by a fifth minimum hamming distance from the fourth valid functional codeword;
  a sixth valid functional codeword representing a functional state of the system; and
  a sixth valid fault codeword representing a fault state of the system and characterized by a sixth minimum hamming distance from the sixth valid functional codeword;
during a first time period, at the first controller:
  in response to detecting functional operation of the first subsystem, storing the first valid functional codeword in a first memory;
  in response to detecting functional operation of the first input, storing the third valid functional codeword in a second memory;
  querying an input register coupled to the second controller;
  detecting, in the input register, a first safety message comprising the fourth valid functional codeword from the second controller; and
  in response to detecting the first safety message in the input register within a first time quantum, storing the fifth valid functional codeword in a third memory;
during a second time period following the first time period, at the first controller, in response to detecting a match between contents of the first memory and the first valid functional codeword, in response to detecting a match between contents of the third memory and the fifth valid functional codeword, and in response to detecting functional operation of the first input, outputting a second safety message comprising the second valid functional codeword and the sixth valid functional codeword;
during a third time period following the second time period, at the first controller:
  in response to detecting functional operation of the first subsystem, storing the first valid functional codeword in the first memory;
  in response to detecting functional operation of the first input, storing the third valid functional codeword in the second memory;
  querying the input register; and
  in response to detecting non-receipt of the third safety message in the input register within a second time quantum, storing the fifth valid fault codeword in a third memory; and
during a fourth time period following the third time period, at the first controller, in response to detecting a match between contents of the first memory and the first valid functional codeword, and in response to detecting a match between contents of the third memory and the fifth valid fault codeword, outputting a fourth safety message comprising the second valid functional codeword and the sixth valid fault codeword.

12. The method of claim 11, further comprising:
during a fifth time period following the second time period and prior to the third time period, at the first controller:
  in response to detecting functional operation of the first subsystem, storing the first valid functional codeword in the first memory;
  querying the input register coupled to the second controller; and
  in response to detecting a fifth safety message from the second controller in the input register within a third time quantum, storing the fifth valid functional codeword in the third memory; and
during a sixth time period following the fifth time period and prior to the third time period, at the first controller, in response to detecting a match between contents of the first memory and the first valid functional codeword, and in response to detecting a mismatch between contents of the third memory and every codeword in the first set of valid codewords, outputting a sixth safety message comprising the second valid functional codeword and the sixth valid fault codeword.

13. The method of claim 11, further comprising:
at the first controller, storing the first set of valid codewords further comprising:
  a seventh valid functional codeword representing a functional timeout state of a third controller within a second safety module coupled to the system; and
  a seventh valid fault codeword representing a fault timeout state of the third controller and characterized by a minimum hamming distance of 8 from the seventh valid functional codeword;
during the first time period, at the first controller, in response to detecting receipt of a fifth safety message from the third controller within a third time quantum, storing the seventh valid functional codeword in a fourth memory; and during the second time period, at the first controller, outputting the second safety message comprising the second valid functional codeword and the sixth valid functional codeword further in response to detecting a match between contents of the fourth memory and the seventh valid functional codeword.

14. The method of claim 11, further comprising:
at the first controller, storing the first set of valid codewords further comprising:
- a seventh valid functional codeword representing a functional timeout state of a third controller within a second safety module coupled to the system;
- a seventh valid fault codeword representing a fault timeout state of the third controller and characterized by a minimum hamming distance of 8 from the seventh valid functional codeword;
- an eighth valid functional codeword representing a functional timeout state of a fourth controller within a third safety module coupled to the system and characterized by a minimum hamming distance of 4 from the seventh valid function codeword;
- an eighth valid fault codeword representing a fault timeout state of the fourth controller and characterized by a minimum hamming distance of 4 from the seventh valid fault codeword and a minimum hamming distance of 8 from the eighth valid functional codeword;
- a ninth valid functional codeword representing a functional timeout state of a set of monitored controllers comprising the third controller and the fourth controller; and
- a ninth valid fault codeword representing a fault timeout state of the set of monitored controllers and characterized by a minimum hamming distance of 8 from the ninth valid functional codeword;

during the first time period, at the first controller:
- in response to detecting receipt of a fifth safety message from the third controller within a third time quantum, storing the seventh valid functional codeword in a fourth memory; and
- in response to detecting non-receipt of a sixth safety message from the fourth controller within a fourth time quantum, storing the eighth valid fault codeword in a fifth memory;

wherein outputting, at the first controller during the second period of time, the second safety message comprises outputting the second safety message comprising the second valid functional codeword, the sixth valid functional codeword, and the ninth valid fault codeword in response to detecting a match between contents of the first memory and the first valid functional codeword, in response to detecting a match between contents of the third memory and the fifth valid functional codeword, in response to detecting functional operation of the first input, in response to detecting a match between contents of the fourth memory and the seventh valid functional codeword, and in response to detecting a match between the fifth memory and the eighth valid fault codeword.

15. The method of claim 11:
wherein the first valid functional codeword comprises an upper byte and a lower byte, and
wherein the upper byte and the lower byte are inverse nibble values to each other.

16. The method of claim 11:
wherein the first valid functional codeword is characterized by a hamming distance of 4 from the second valid functional codeword and a hamming distance of 4 from the second valid fault codeword; and
wherein the first valid fault codeword is characterized by a hamming distance of 4 from the second valid functional codeword, a hamming distance of 4 from the second valid fault codeword, and a hamming distance of 8 from the first valid functional codeword.

17. The method of claim 11, wherein storing, at the first controller, the first set of valid codewords comprises storing the second valid fault codeword characterized by a minimum hamming distance of 4 from the second valid functional codeword.

18. The method of claim 11, wherein storing, at the first controller, the first set of valid codewords comprises:
- storing the first valid functional codeword representing a functional state of an arithmetic logic unit within the first controller;
- storing the first valid fault codeword representing a fault state of the arithmetic logic unit and characterized by a minimum hamming distance of 8 from the first valid functional codeword;
- storing a seventh valid functional codeword representing a functional state a flash memory within the first controller and characterized by a minimum hamming distance of 4 from the first valid functional codeword and a minimum hamming distance of 4 from the first valid fault codeword;
- storing a seventh valid fault codeword representing a fault state the flash memory and characterized by a minimum hamming distance of 4 from the first valid functional codeword, a minimum hamming distance of 4 from the first valid fault codeword, and a minimum hamming distance of 8 from the seventh valid functional codeword;
- storing an eighth valid functional codeword representing a functional state a stack overflow safety mechanism within the first controller and characterized by a minimum hamming distance of 4 from the first valid functional codeword and a minimum hamming distance of 4 from the seventh valid functional codeword; and
- storing an eighth valid fault codeword representing a fault state the stack overflow safety mechanism and characterized by a minimum hamming distance of 4 from the first valid fault codeword, a minimum hamming distance of 4 from the seventh valid fault codeword, and a minimum hamming distance of 8 from the eighth valid functional codeword.

19. The method of claim 18, wherein storing, at the first controller, the first set of valid codewords comprises:
- storing a bit pattern of "1101111011101101" as the first valid functional codeword;
- storing a bit pattern of "1000001000101000" as the first valid fault codeword;
- storing a bit pattern of "1110110111011110" as the seventh valid functional codeword;
- storing a bit pattern of "0010100010000010" as the seventh valid fault codeword;
- storing a bit pattern of "1110101110111110" as the eighth valid functional codeword; and
- storing a bit pattern of "1101011101111101" as the eighth valid fault codeword.

20. A method comprising:
at a first controller in a safety module coupled to a system, storing a first set of valid codewords comprising:
- a first valid functional codeword representing a functional state of a first subsystem of a first set of subsystems within the first controller;

a first valid fault codeword representing a fault state of the first subsystem and characterized by a first minimum hamming distance from the first valid functional codeword;

a second valid functional codeword representing a functional state of the first controller; and a second valid fault codeword representing a fault state of the first controller and characterized by a second minimum hamming distance from the second valid functional codeword;

during a first time period, at the first controller, in response to detecting functional operation of the first subsystem, storing the first valid functional codeword in a first memory;

during a second time period following the first time period, at the first controller, in response to detecting a match between contents of the first memory and the first valid functional codeword, outputting a first safety message comprising the second valid functional codeword;

during a third time period following the second time period, at the first controller, in response to detecting functional operation of the first subsystem, storing the first valid functional codeword in the first memory; and during a fourth time period following the third time period, at the first controller, in response to detecting a mismatch between contents of the first memory and every codeword in the first set of valid codewords, outputting a second safety message comprising the second valid fault codeword.

\* \* \* \* \*